United States Patent
Weng et al.

(10) Patent No.: US 10,692,725 B2
(45) Date of Patent: Jun. 23, 2020

(54) DIRECTED SELF-ASSEMBLY PROCESS WITH SIZE-RESTRICTED GUIDING PATTERNS

(71) Applicant: Taiwan Semiconductor Manufacturing Co., Ltd., Hsin-Chu (TW)

(72) Inventors: Ming-Huei Weng, New Taipei (TW);
Kuan-Hsin Lo, Nantou County (TW);
Wei-Liang Lin, Hsin-Chu (TW);
Chi-Cheng Hung, Miaoli County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 16/041,892

(22) Filed: Jul. 23, 2018

(65) Prior Publication Data
US 2018/0350613 A1    Dec. 6, 2018

Related U.S. Application Data

(63) Continuation of application No. 15/197,467, filed on Jun. 29, 2016, now Pat. No. 10,056,265.
(Continued)

(51) Int. Cl.
*H01L 21/30* (2006.01)
*H01L 21/02* (2006.01)
(Continued)

(52) U.S. Cl.
CPC ...... *H01L 21/3065* (2013.01); *H01L 21/0274* (2013.01); *H01L 21/0337* (2013.01); *H01L 21/30604* (2013.01); *H01L 21/31144* (2013.01)

(58) Field of Classification Search
CPC ............. H01L 21/3065; H01L 21/0274; H01L 21/0337; H01L 21/30604
(Continued)

(56) References Cited

U.S. PATENT DOCUMENTS 8,039,179 B2   10/2011   Shieh et al.
8,039,196 B2   10/2011   Kim et al.
(Continued)

FOREIGN PATENT DOCUMENTS

CN    101405216    4/2009
CN    103809370    5/2014
(Continued)

OTHER PUBLICATIONS

Ji Xu et al., "Directed Self-Assembly of Block Copolymers on Two-Dimensional Chemical Patterns Fabricated by Electro-Oxidation Nanolithography", Adv. Mater. 2010, 22, 2268-2272, 2010 Wiley-VCH Verlag GmbH & Co. KGaA, Weinheim.
(Continued)

*Primary Examiner* — Sheikh Maruf
(74) *Attorney, Agent, or Firm* — Haynes and Boone, LLP

(57) ABSTRACT

A method includes providing a substrate; forming mandrel patterns over the substrate; and forming spacers on sidewalls of the mandrel patterns. The method further includes removing the mandrel patterns, thereby forming trenches that are at least partially surrounded by the spacers. The method further includes depositing a copolymer material in the trenches, wherein the copolymer material is directed self-assembling; and inducing microphase separation within the copolymer material, thereby defining a first constituent polymer surrounded by a second constituent polymer. The mandrel patterns have restricted sizes and a restricted configuration. The first constituent polymer includes cylinders arranged in a rectangular or square array.

20 Claims, 22 Drawing Sheets

Related U.S. Application Data

(60) Provisional application No. 62/310,020, filed on Mar. 18, 2016.

(51) Int. Cl.
  *H01L 21/3065* (2006.01)
  *H01L 21/306* (2006.01)
  *H01L 21/033* (2006.01)
  *H01L 21/027* (2006.01)
  *H01L 21/311* (2006.01)

(58) Field of Classification Search
  USPC .......................................................... 438/702
  See application file for complete search history.

(56) References Cited

U.S. PATENT DOCUMENTS

| | | | |
|---|---|---|---|
| 8,101,261 B2 | 1/2012 | Millward et al. | |
| 8,114,306 B2 | 2/2012 | Cheng et al. | |
| 8,202,681 B2 | 6/2012 | Lin et al. | |
| 8,623,770 B1* | 1/2014 | Gao | H01L 21/02186 |
| | | | 257/E21.236 |
| 8,728,332 B2 | 5/2014 | Lin et al. | |
| 8,822,243 B2 | 9/2014 | Yan et al. | |
| 8,853,085 B1 | 10/2014 | Abdallah et al. | |
| 8,871,408 B2 | 10/2014 | Takekawa et al. | |
| 8,956,808 B2 | 2/2015 | Schmid et al. | |
| 9,087,699 B2 | 7/2015 | Millward | |
| 9,371,427 B2 | 6/2016 | Kobayashi et al. | |
| 9,466,534 B1 | 10/2016 | Brink et al. | |
| 9,576,817 B1 | 2/2017 | Cheng et al. | |
| 9,684,236 B1* | 6/2017 | Hsieh | B82Y 10/00 |
| 2004/0058518 A1* | 3/2004 | Fang | H01L 21/0332 |
| | | | 438/595 |
| 2004/0119170 A1* | 6/2004 | Kim | H01L 21/76831 |
| | | | 257/775 |
| 2004/0206996 A1* | 10/2004 | Lee | H01L 23/528 |
| | | | 257/296 |
| 2005/0227492 A1* | 10/2005 | Hah | B82Y 30/00 |
| | | | 438/696 |
| 2006/0091468 A1 | 5/2006 | Liaw | |
| 2008/0081461 A1 | 4/2008 | Lee et al. | |
| 2008/0176767 A1 | 7/2008 | Millward | |
| 2008/0274413 A1* | 11/2008 | Millward | B81C 1/00031 |
| | | | 430/5 |
| 2010/0136792 A1 | 6/2010 | Mebarki et al. | |
| 2010/0252896 A1* | 10/2010 | Smayling | H01L 21/823871 |
| | | | 257/401 |
| 2011/0053087 A1 | 3/2011 | Nielsen et al. | |
| 2011/0117744 A1 | 5/2011 | Ito | |
| 2011/0147984 A1 | 6/2011 | Chang et al. | |
| 2011/0281208 A1 | 11/2011 | Lin et al. | |
| 2012/0061807 A1* | 3/2012 | Tran | H01L 21/0337 |
| | | | 257/635 |
| 2012/0076978 A1 | 3/2012 | Millward et al. | |
| 2012/0244458 A1 | 9/2012 | Luong et al. | |
| 2012/0244711 A1* | 9/2012 | Yin | H01L 21/0337 |
| | | | 438/703 |
| 2012/0278776 A1 | 11/2012 | Lei et al. | |
| 2013/0059438 A1 | 3/2013 | Zhou et al. | |
| 2013/0183827 A1* | 7/2013 | Millward | H01L 21/0273 |
| | | | 438/694 |
| 2013/0295769 A1 | 11/2013 | Lin et al. | |
| 2013/0320451 A1 | 12/2013 | Liu et al. | |
| 2014/0069325 A1 | 3/2014 | Kawanishi | |
| 2014/0097520 A1 | 4/2014 | Millward | |
| 2014/0107296 A1 | 4/2014 | Millward et al. | |
| 2014/0138800 A1* | 5/2014 | He | H01L 29/02 |
| | | | 257/632 |
| 2014/0193974 A1 | 7/2014 | Lee et al. | |
| 2014/0193976 A1 | 7/2014 | Kim et al. | |
| 2014/0215421 A1 | 7/2014 | Chen et al. | |
| 2014/0234466 A1 | 8/2014 | Gao et al. | |
| 2014/0242794 A1 | 8/2014 | Lin et al. | |
| 2014/0264461 A1 | 9/2014 | Xu et al. | |
| 2014/0264760 A1 | 9/2014 | Chang et al. | |
| 2014/0264896 A1 | 9/2014 | Lu et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2014/0315390 A1 | 10/2014 | Abdallah et al. | |
| 2014/0322917 A1 | 10/2014 | Abdallah et al. | |
| 2015/0024597 A1* | 1/2015 | Gao | H01L 21/3086 |
| | | | 438/694 |
| 2015/0031207 A1* | 1/2015 | Bencher | H01L 21/0337 |
| | | | 438/696 |
| 2015/0225850 A1* | 8/2015 | Arora | C23C 16/45525 |
| | | | 216/51 |
| 2015/0243514 A1 | 8/2015 | Ruiz et al. | |
| 2015/0243518 A1 | 8/2015 | deVilliers | |
| 2015/0262815 A1 | 9/2015 | Wu et al. | |
| 2015/0279957 A1* | 10/2015 | Wang | H01L 29/66795 |
| | | | 257/401 |
| 2015/0303067 A1 | 10/2015 | Liu et al. | |
| 2015/0340232 A1 | 11/2015 | Belledent | |
| 2015/0380252 A1 | 12/2015 | Xu et al. | |
| 2015/0380259 A1 | 12/2015 | Chang | |
| 2016/0181100 A1 | 6/2016 | deVilliers et al. | |
| 2016/0293408 A1* | 10/2016 | Komatsu | C08F 293/00 |
| 2016/0336193 A1* | 11/2016 | Park | H01L 21/31144 |
| 2017/0162380 A1* | 6/2017 | Cheng | H01L 21/0271 |
| 2017/0194430 A1* | 7/2017 | Wood | H01L 29/0649 |
| 2017/0271164 A1* | 9/2017 | Weng | H01L 21/3065 |
| 2017/0287790 A1* | 10/2017 | Rastogi | H01L 22/12 |

FOREIGN PATENT DOCUMENTS

| | | |
|---|---|---|
| CN | 104425214 | 3/2015 |
| CN | 105051863 | 11/2015 |
| KR | 20150138335 | 12/2015 |
| KR | 20150072362 | 6/2016 |

OTHER PUBLICATIONS

Roel Gronheid et al., "Addressing the Challenges of Directed Self Assembly Implementation," IMEC 2011, Litho Extensions Symposium Oct. 20, 2011, Miami USA. 21 pages.

Delgadillo et al., "All Track Directed Self-Assembly of Block Copolymers: Process Flow and Origin of Defects," Proc. SPIE 8323, Alternative Lithographic Technologies IV, 83230D (Mar. 1, 2012), 9 pages.

Chi-Chun Liu et al., "Fabrication of Lithographically Defined Chemically Patterned Polymer Brushes and Mats," Macromolecules, 2011, 44 (7), pp. 1876-1885, ACS Publications, 2011 American Chemical Society.

* cited by examiner

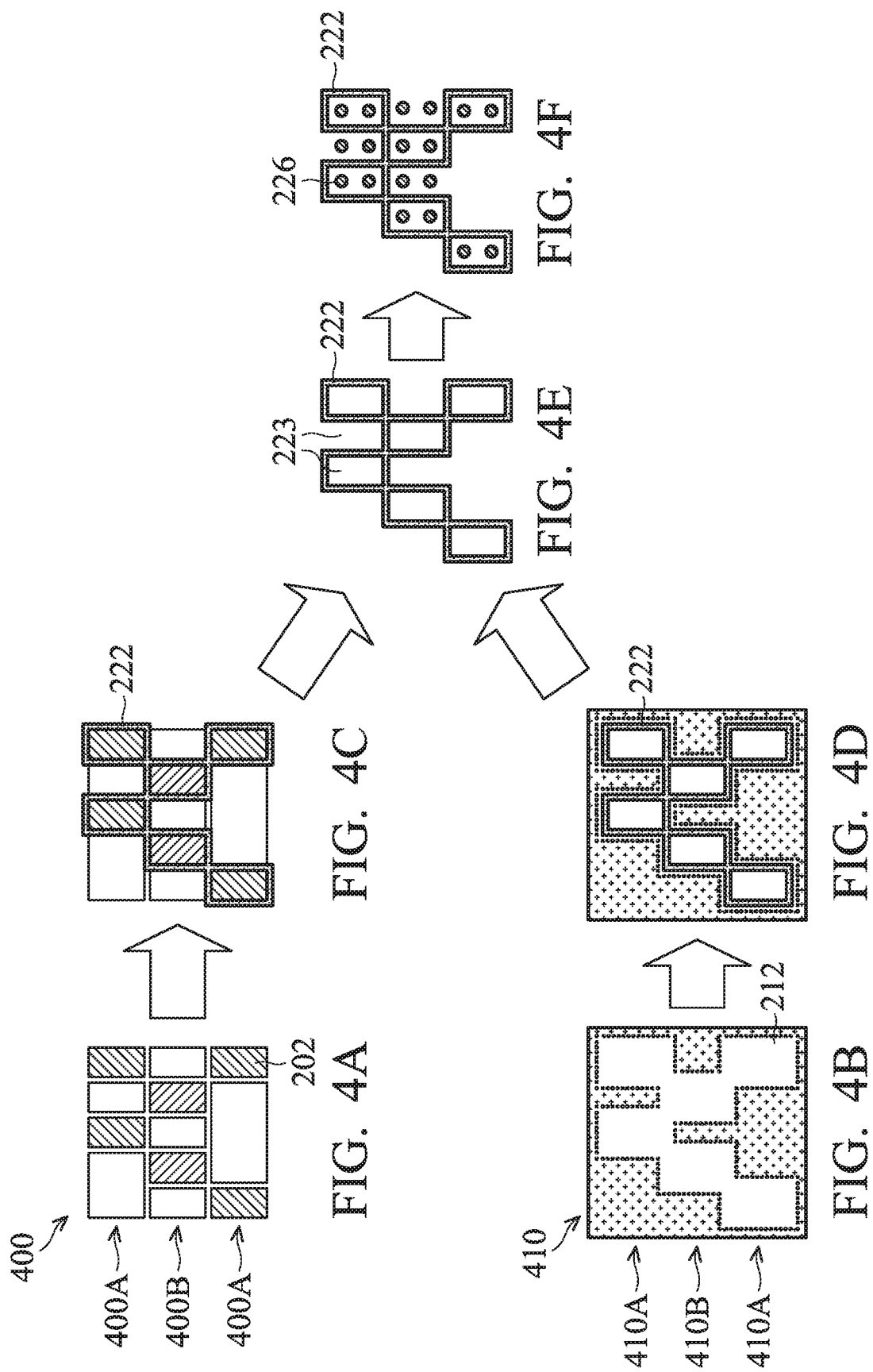

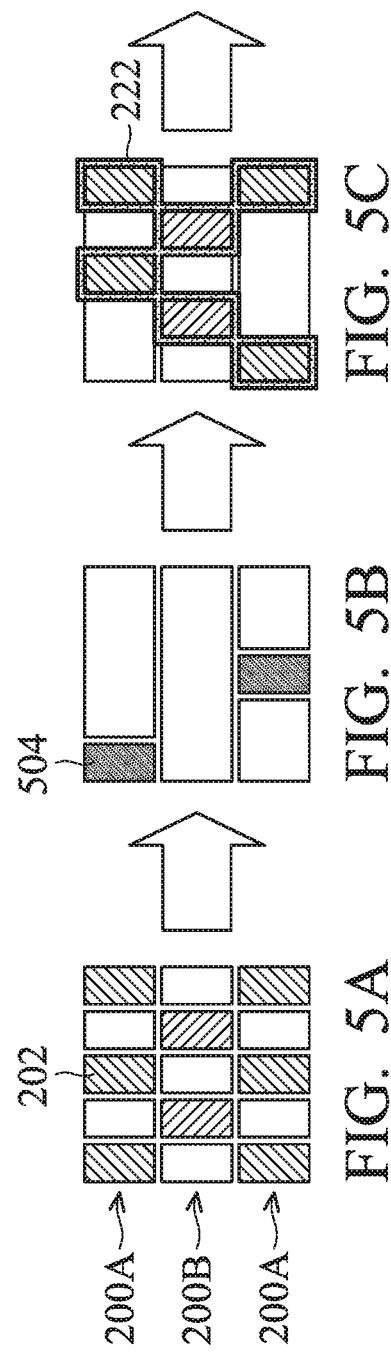

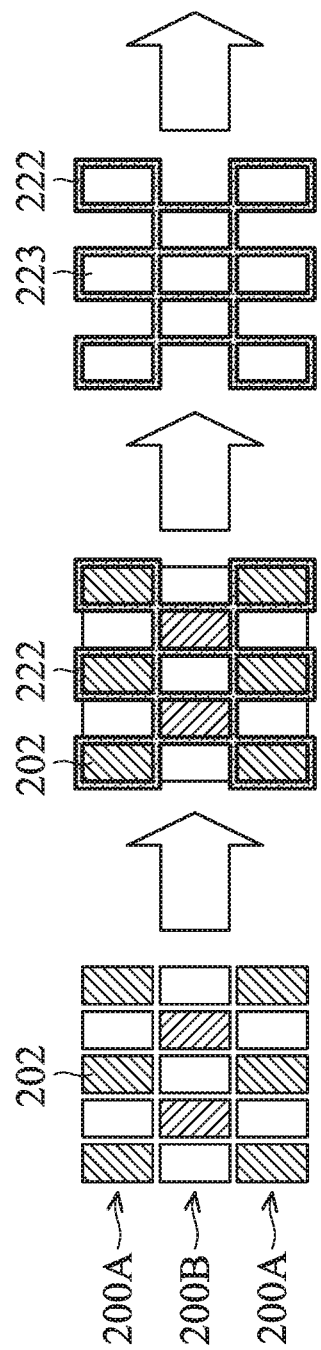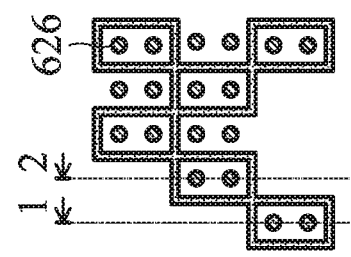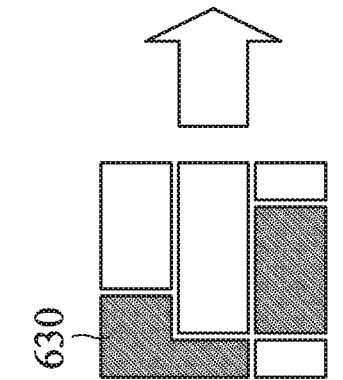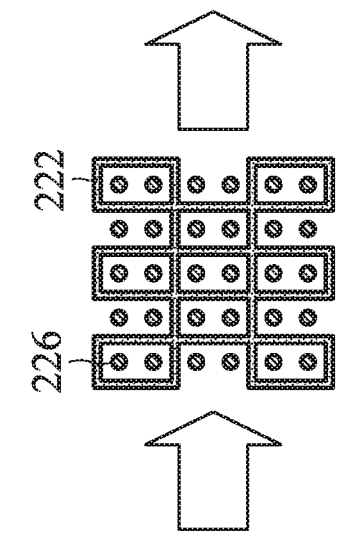

DIRECTED SELF-ASSEMBLY PROCESS WITH SIZE-RESTRICTED GUIDING PATTERNS

PRIORITY

This application is a continuation of U.S. patent application Ser. No. 15/197,467, entitled "Directed Self-Assembly Process with Size-Restricted Guiding Patterns," filed Jun. 29, 2016, to Ming-Huei Weng et al., which claims the benefit of U.S. Prov. App. Ser. No. 62/310,020, entitled "Directed Self-Assembly Process with Size-Restricted Guiding Patterns," filed Mar. 18, 2016, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as optical lithography approaches its technological and economical limits, a directed self-assembly (DSA) process emerges as a potential candidate for patterning dense features such as contact holes. A DSA process takes advantage of the self-assembling properties of materials, such as block copolymers, to reach nanoscale dimensions while meeting the constraints of current manufacturing. Typical DSA processes use a guide pattern that "guides" the self-assembling process. The geometry of the guide pattern may affect the configuration of the self-assembled polymer features, as well as the final pattern density. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3E-2, 3F-2, 3G-2, 3H-2, 3I-2, 3J-2, 3K-2, 3L-2, 3N-2, 3O-2, 3Q-2, 3R-2, and 3S-2 are cross sectional views (along "2-2" lines in FIGS. 2A, 2B, 3M, and 3P where applicable) of forming a semiconductor device according to the method of FIGS. 1A and 1B, in accordance with some embodiments.

FIGS. 4A, 4B, 4C, 4D, 4E, and 4F illustrate top views of forming a semiconductor device according to the method of FIG. 1A, in accordance with some embodiments.

FIGS. 5A, 5B, 5C, 5D, and 5E illustrate top views of forming a semiconductor device according to the method of FIG. 1A, in accordance with some embodiments.

FIGS. 6A, 6B, 6C, 6D, 6E, and 6F illustrate top views of forming a semiconductor device according to the method of FIG. 1A, in accordance with some embodiments.

FIGS. 6G-1 and 6G-2 illustrate cross sectional views of forming a semiconductor device along "1-1" and "2-2" lines in FIG. 6F, according to the method of FIG. 1A, in accordance with some embodiments.

FIGS. 7A-1, 7A-2, 7B-1, 7B-2, 7C-1, 7C-2, 7D-1, 7D-2, 7E-1, 7E-2, 7F-1, and 7F-2 illustrate cross sectional views of forming a semiconductor device according to the method of FIGS. 1A and 1C, in accordance with some embodiments.

DETAILED DESCRIPTION

Figure 1A:
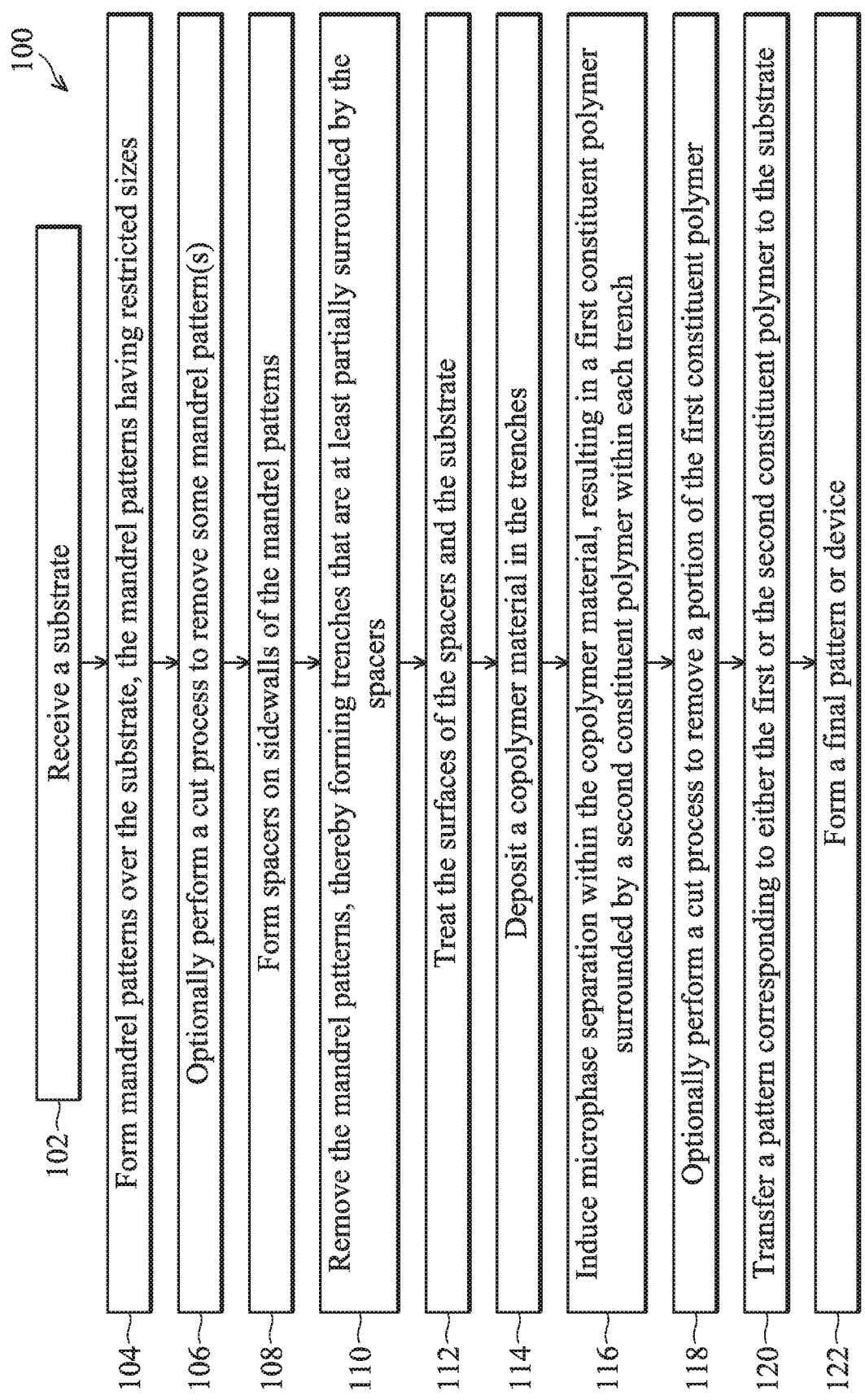
FIG. 1A shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to methods for manufacturing semiconductor devices using a DSA process. In a typical DSA process, a block copolymer (BCP) film having constituent polymers is formed over lithographically defined surfaces, and a microphase separation is induced to cause the constituent polymer molecules to self-assemble, thus creating densely packed features with highly uniform dimensions and shapes. Typically, a guide pattern is created by a lithography process and the guide pattern "guides" the above DSA process. Some examples of the features that can be created using DSA processes include cylindrical and lamellar nanodomains that are oriented perpendicular to a substrate. The cylindrical nanodomains are found particularly promising for creating densely packed small contact holes for semiconductor devices. However, a typical BCP spontaneously forms hexagonal arrays of cylindrical nanodomains in a large area or a row of cylindrical nanodomains in a narrow trench. Either case does not suit the existing semiconductor fabrication very well because typical contact holes in a semiconductor device are designed to be square-shaped. A rectangular or square array of cylindrical nanodomains will better suit existing semiconductor design and fabrication. Accordingly, a goal of the present disclosure is to create cylindrical nanodomains that are arranged in a rectangular or square array. In an embodiment, the present disclosure achieves the goal by devising some novel guiding patterns for the DSA processes.

Referring now to FIG. 1A, a flow chart of a method 100 of forming a semiconductor device using a DSA process is illustrated according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. An overview of the method 100 is briefly described below in conjunction with FIGS. 2A-2G. It is followed by a detailed description of the method 100 in conjunction with FIGS. 3A through 3S-2 which are different views of a semiconductor structure 300 according to various aspects of the present disclosure.

Referring to FIG. 1A, the method 100 receives a substrate at operation 102, and forms mandrel patterns over the substrate at operation 104. The mandrel patterns have restricted sizes for constraining a subsequent DSA process. The method 100 may optionally remove some of the mandrel patterns using a cut process at operation 106. Then it forms spacers on sidewalls of the mandrel patterns at operation 108. After removing the mandrel patterns at operation 110 and treating the spacers at operation 112, the method 100 performs a DSA process at operations 114 and 116 using a BCP. The DSA process uses the treated spacers as guiding patterns. The configuration of the spacers and the composition of the BCP result in desired constituent polymers (or nanodomains) arranged in square or rectangular arrays. The method 100 may optionally remove some of the constituent polymers at operation 118 and transfer a pattern corresponding to one of the constituent polymers to the substrate. In the present embodiment, the desired constituent polymers are cylindrically shaped and are suitable for forming contact holes.

Figure 2B:
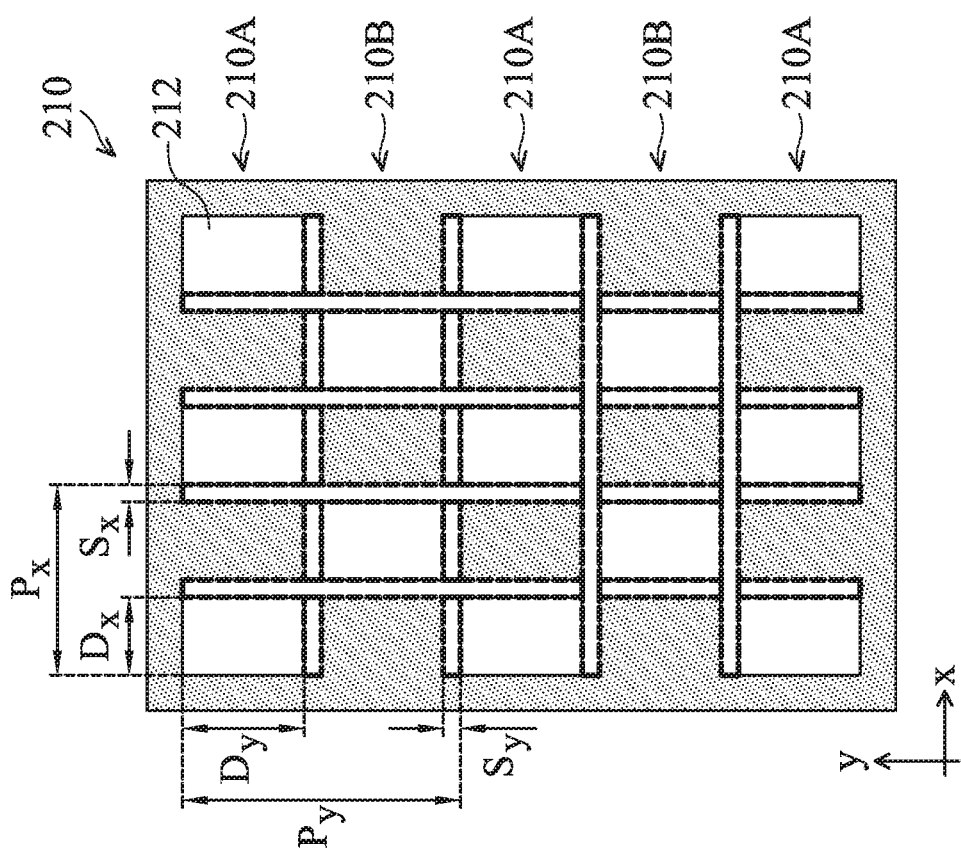
FIGS. 2A and 2B are top views of target mandrel patterns in the method of FIG. 1A, in accordance with some embodiments.
Figure 2A:
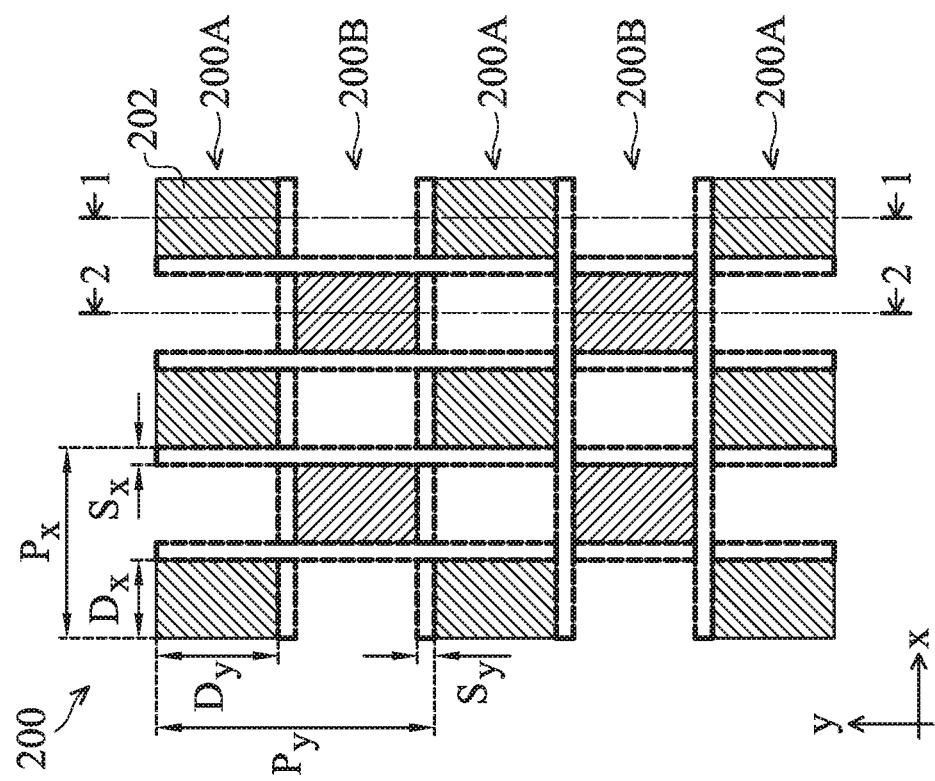

FIGS. 2A and 2B show top views of some examples of the mandrel patterns to be formed, constructed according to various aspects of the present disclosure. Referring to FIG. 2A, a target pattern 200 includes a plurality of mandrel patterns 202 arranged in a checkerboard-like configuration. Unlike a typical checkerboard, the mandrel patterns 202 are spaced apart. The mandrel patterns 202 can be divided into two groups. A first group 200A of the mandrel patterns 202 is arranged in an array with rows and columns (a 3×3 array in this example). A second group 200B of the mandrel patterns 202 is arranged in another array with rows and columns (a 2×2 array in this example). Rows of the group (or array) 200A are interleaved with rows of the group (or array) 200B, and columns of the group 200A are interleaved with columns of the group 200B.

The mandrel patterns 202 are generally rectangular and are of about the same size. In the example shown in FIG. 2A, each mandrel pattern 202 has a dimension $D_x$ along a direction "x" and a dimension $D_y$ along a direction "y" perpendicular to the direction "x." A mandrel pattern 202 in the group 200A is spaced apart from an adjacent mandrel pattern 202 in the group 200B by a spacing $S_x$ along the direction "x" and a spacing $S_y$ along the direction "y." A pitch $P_x$ of the mandrel patterns 202 along the direction "x" is equal to twice of $D_x$ plus twice of $S_x$. A pitch $P_y$ of the mandrel patterns 202 along the direction "y" is equal to twice of $D_y$ plus twice of $S_y$. In the present embodiment, $S_x$ is about equal to $S_y$, which is a thickness of the spacers to be formed on sidewalls of the mandrel patterns 202 at the operation 108 (FIG. 1A). The mandrel patterns 202 are island-type mandrel patterns and the spacers are to be formed on outer sidewalls of the mandrel patterns 202.

Referring to FIG. 2B, a target pattern 210 includes a plurality of mandrel patterns 212 that have about the same dimensions ($D_x$ and $D_y$) and the same configuration ($S_x$, $S_y$, $P_x$, and $P_y$) as the mandrel patterns 202. One difference between the target patterns 200 and 210 is that the mandrel patterns 212 are trench-type patterns and the spacers are to be formed on inner sidewalls of the mandrel patterns 212. Similar to the target pattern 200, the target pattern 210 can be divided into two groups. A first group 210A of the mandrel patterns 212 is arranged in an array with rows and columns (a 3×3 array in this example). A second group 210B of the mandrel patterns 212 is arranged in another array with rows and columns (a 2×2 array in this example). Rows of the group (or array) 210A are interleaved with rows of the group (or array) 210B, and columns of the group 210A are interleaved with columns of the group 210B.

FIGS. 2C-2G illustrate some exemplary configurations of guiding patterns 222 and desired nanodomains 226 in the DSA process (operation 116). The guiding patterns 222 are derived from the mandrel patterns 202 or 212. In the present embodiment, the guiding patterns 222 are spacers formed on sidewalls of the mandrel patterns 202 or 212. Therefore, the geometry of the mandrel patterns 202 or 212 controls the geometry of the guiding patterns 222. The size of the nanodomains 226 is determined by the composition of the BCP in operation 116, such as the types and the ratio of constituent polymers in the BCP. In the present embodiment, the composition of the BCP and the surface property of the guiding patterns 222 are tuned to produce cylindrical nanodomains 226 for contact holes. As shown in FIGS. 2C-2F, the geometry of the guiding patterns 222 are designed such that the nanodomains 226 form a rectangular or square array in each of the guiding patterns, and not a hexagonal array. An immediate benefit is that the nanodomains 226 conform to existing IC design and fabrication flow.

Figure 2D:
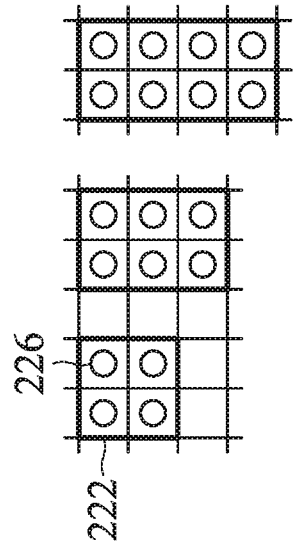
FIGS. 2C, 2D, 2E, 2F, and 2G illustrate some configurations of DSA guiding patterns and nanodomains, according to aspects of the present disclosure.
Figure 2C:
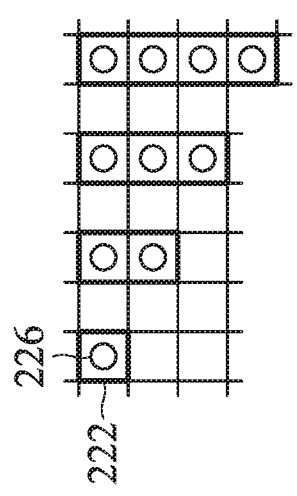
Figure 2F:
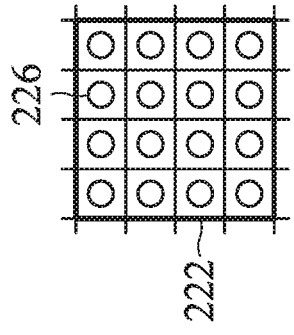
Figure 2G:
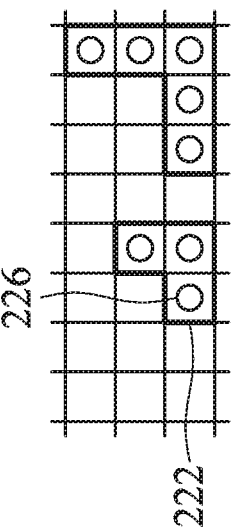
Figure 2E:
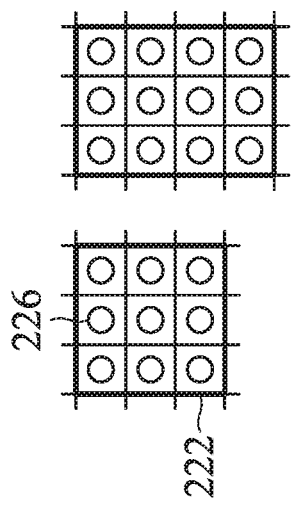

Factors affecting the geometrical design of the guiding patterns 222 include photolithography resolution in forming the mandrel patterns 202 and 212, molecular weight of the BCP, and thermal stability of the constituent polymers. For example, a smaller guiding pattern (having a smaller critical dimension) may demand a higher resolution in the photolithograph processes. A larger guiding pattern may cause the nanodomains to form a hexagonal array because arranging in a hexagonal array is more thermally stable than arranging in a square array. In the present embodiment, the geometry of the guiding patterns 222 is designed such that each array of nanodomains 226 has at most 4 rows and at most 4 columns. In another word, the array may have a size (rows by columns or columns by rows) of 1 by 1, 1 by 2, 1 by 3, or 1 by 4 as shown in FIG. 2C, or a size of 2 by 2, 2 by 3, or 2 by 4 as shown in FIG. 2D, or a size of 3 by 3 or 3 by 4 as shown in FIG. 2E, or a size of 4 by 4 as shown in FIG. 2F. Configurations shown in FIG. 2G may be produced by having an L-shaped guiding pattern 222 or by removing some of the nanodomains 226 from a rectangular or square array of nanodomains in one of the FIGS. 2C-2F.

Figure 3A:
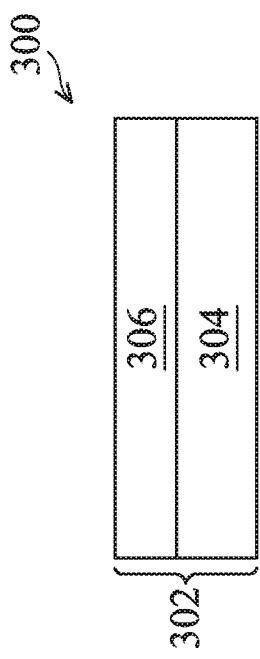
FIGS. 3A, 3B, 3C, and 3D are cross sectional views of forming a semiconductor device according to the method of FIG. 1A, in accordance with some embodiments.

In below paragraphs, the method 100 is described in detail in conjunction with FIG. 3A through FIG. 3S-2 which are different views of a semiconductor structure 300 according to various aspects of the present disclosure. The semiconductor structure 300 may be an intermediate device fabricated during processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

At operation 102, the method 100 (FIG. 1A) receives a substrate 302. Referring to FIG. 3A, the substrate 302 includes a material layer 304 and a patterning target layer 306 where one or more patterns are to be formed therein. The material layer 304 includes one or more layers of material or composition. In some embodiments, the material layer 304 includes an elementary semiconductor (e.g., silicon or germanium) and/or a compound semiconductor (e.g., silicon germanium, silicon carbide, gallium arsenic, indium arsenide, gallium nitride, and indium phosphide). In some embodiments, the material layer 304 includes alloy semiconductors, such as silicon germanium carbide, gallium arsenic phosphide, and gallium indium phosphide. The material layer 304 may also comprise non-semiconductor materials including soda-lime glass, fused silica, fused quartz, calcium fluoride ($CaF_2$), and/or other suitable materials. In some embodiments, the material layer 304 has one or more layers defined within it, such as having an epitaxial layer overlying a bulk semiconductor. In some embodiments, the material layer 304 includes a semiconductor-on-insulator (SOI) substrate. In an embodiment, the material layer 304 may include doped regions and have circuits formed thereon or therein.

The patterning target layer 306 is a hard mask layer in an embodiment. For example, it may include a dielectric material such as silicon oxide or silicon nitride. In another embodiment, the patterning target layer 306 is an inter-layer dielectric (ILD) layer or an inter-metal dielectric (IMD) layer. For example, the patterning target layer 306 may include a low-k or extreme low-k material. For example, the patterning target layer 306 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The patterning target layer 306 may be formed over the material layer 304 through deposition or other methods, such as physical vapor deposition (PVD), chemical vapor deposition (CVD) including plasma enhanced CVD (PECVD), and atomic layer deposition (ALD).

At operation 104, the method 100 (FIG. 1) forms mandrel patterns (e.g., the mandrel patterns 202 (FIG. 2A) or 212 (FIG. 2B)) over the patterning target layer 306. The mandrel patterns are to have restricted sizes as discussed above. This involves a variety of processes such as deposition, photolithography, and etching, which are further described below.

Figure 3B:
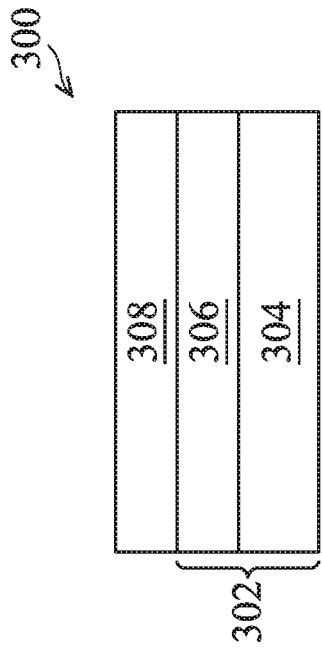

Referring to FIG. 3B, a hard mask (HM) layer 308 is deposited over the patterning target layer 306. In some embodiments, the HM layer 308 includes one or more dielectric materials, such as silicon oxide, silicon nitride, and/or silicon oxynitride (SiON). In some embodiments, the HM layer 308 includes titanium nitride (TiN). In some embodiments, the HM layer 308 has a thickness in a range from about 5 nm to about 50 nm. In some embodiments, the HM layer 308 is formed using one or more processes selected from the group consisting of CVD, PVD, ALD, spin-on methods, sputtering, thermal oxidation, and a combination thereof.

Figure 1B:
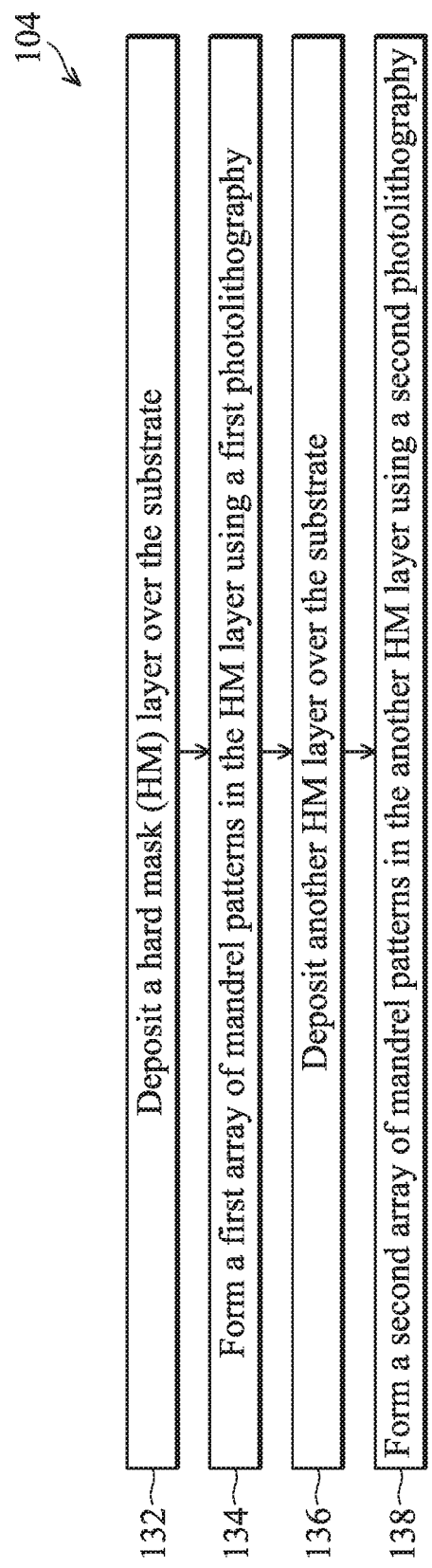
FIGS. 1B and 1C show flow charts of a method of fabricating a semiconductor device, according to an embodiment of the method of FIG. 1A.

In some embodiments, if the resolution of the photolithography equipment permits, the mandrel patterns 202 or 212 may be formed in the HM layer 308 using one photolithography process. In the present embodiment, the method 100 uses a double patterning method as shown in FIG. 1B to alleviate some of the requirements of the photolithography processes, such as optical wavelength and critical dimensions. Particularly, the double patterning method forms the group 200A (or 210A) using a first photolithography process and forms the group 200B (or 210B) using a second photolithography.

Figure 3C:
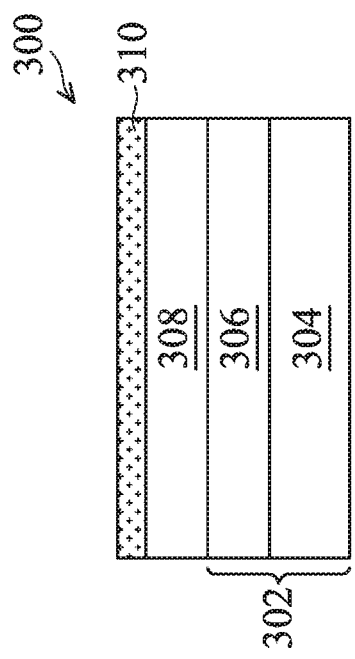

Referring to FIG. 1B, at operation 132, the method 100 forms another HM layer 310 over the HM layer 308 (FIG. 3C). The HM layer 310 may include a dielectric material, such as silicon oxide, silicon nitride, silicon oxynitride (SiON), or a low-k dielectric material; and may be formed using one or more deposition processes aforementioned. The HM layer 310 has different etch selectivity with respect to the HM layer 308.

Figure 3D:
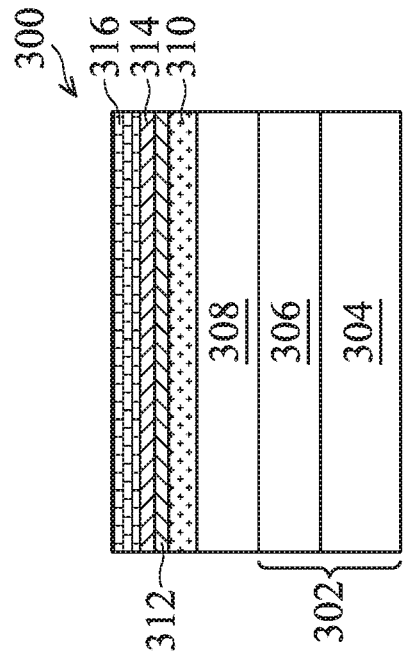

The method 100 (FIG. 1B) forms the group 200A (or 200B) of the mandrel patterns 202 (or 212) in the HM layer 310 using a process including a first photolithography and one or more etching processes. Referring to FIG. 3D, a tri-layer stack is formed over the HM layer 310. The tri-layer stack includes a bottom layer 312 over the HM layer 310, a middle layer 314 over the bottom layer 312, and a photoresist (or resist) 316 over the middle layer 314. In some embodiments, the bottom layer 312 and the middle layer 314 are optional, and the resist layer 316 may be formed directly over the HM layer 310. In embodiments, the bottom layer 312 includes a bottom anti-reflection coating polymeric material, and the middle layer 314 includes silicon-containing polymer. In an embodiment, the resist 316 is a polymer sensitive to a radiation employed by the first photolithograph. For example, the resist 316 may be sensitive to an I-line light, a DUV light (e.g., 248 nm radiation by krypton fluoride (KrF) excimer laser or 193 nm radiation by argon fluoride (ArF) excimer laser), a EUV light (e.g., 13.5 nm light), an e-beam, an x-ray, or an ion beam in some embodiments. The bottom layer 312 and the middle layer 314 may be formed using deposition methods discussed above, including spin-on coating. The resist 316 is spin-on coated onto the middle layer 314 in the present embodiment.

Figures 2, 3E:
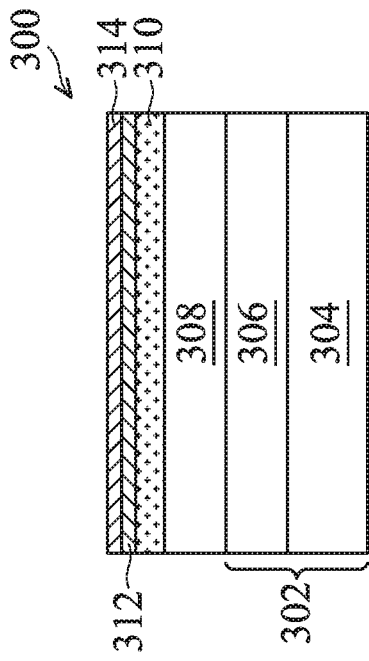
Figures 2, 3F:
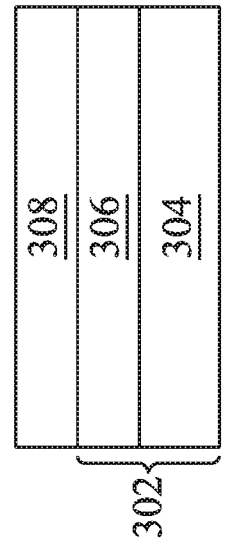
Figures 1, 3E:
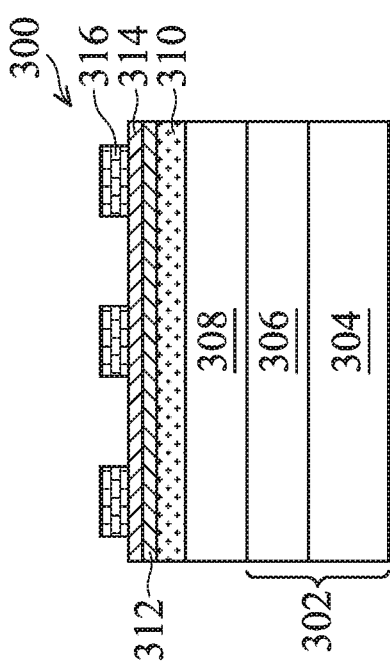
FIGS. 3E-1, 3F-1, 3G-1, 3H-1, 3I-1, 3J-1, 3K-1, 3L-1, 3N-1, 3O-1, 3Q-1, 3R-1, and 3S-1 are cross sectional views (along "1-1" lines in FIGS. 2A, 2B, 3M, and 3P where applicable) of forming a semiconductor device according to the method of FIGS. 1A and 1B, in accordance with some embodiments.
Figures 1, 3F:
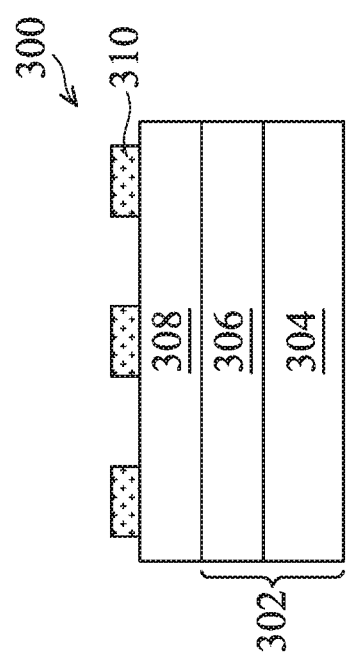

Referring to FIGS. 3E-1 and 3E-2, the resist 316 is patterned to have the geometries of the group 200A of the mandrel patterns 202 using the first photolithography process. In an embodiment, the first photolithography process includes exposing the resist 316 to a radiation source using a mask having patterns corresponding to the group 200A, performing post-exposure bake processes, and developing the resist 316 to remove portions thereof, which are either exposed or unexposed portions depending on the tone of the resist and the developing process. The developed resist 316 is also referred to as a resist pattern 316. In another embodiment, the first photolithography process may employ other technology, such as electron-beam direct writing without using a mask.

Referring to FIGS. 3F-1 and 3F-2, the HM layer 310 is etched to have the geometries of the group 200A. This involves one or more etching processes. For example, the middle layer 314 is etched through openings of the resist pattern 316, the bottom layer 312 is etched through openings of the middle layer 314, and the HM layer 310 is etched through openings of the bottom layer 312. The resist pattern 316, the middle layer 314, and the bottom layer 312 are removed, leaving the patterned HM layer 310 over the HM layer 308. The etching process for opening the HM layer 310 does not (or insignificantly) etch the HM layer 308. The patterned HM layer 310 forms a first plurality of mandrel patterns over the HM layer 308, corresponding to the group 200A (or 210A) of the mandrel patterns 202 (or 212).

The etching processes may use a dry (plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The resist pattern 316 may be removed using a plasma ashing process or a resist stripping process.

Figures 2, 3G:
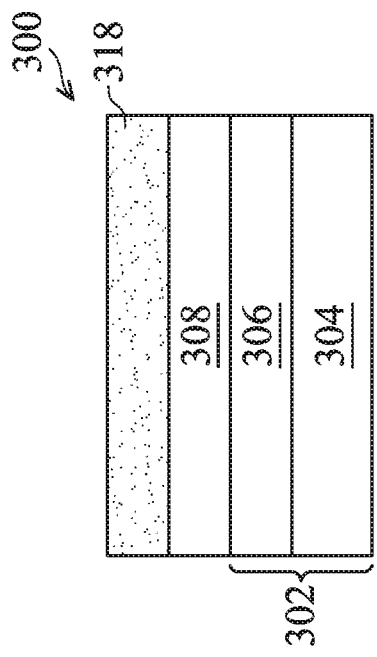

At operation 136, the method 100 (FIG. 1B) deposits another HM layer 318 over the patterned hard mask layer 308 in preparation for a second photolithography process. Referring to FIGS. 3G-1 and 3G-2, the HM layer 318 is formed over the HM layer 308 and covering the patterned HM layer 310. The HM layer 318 may use a dielectric material such as silicon oxide, silicon nitride, silicon oxynitride (SiON), or a low-k dielectric material. The HM layer 318 has different etch selectivity with respect to the HM layers 310 and 308.

Figures 2, 3H:
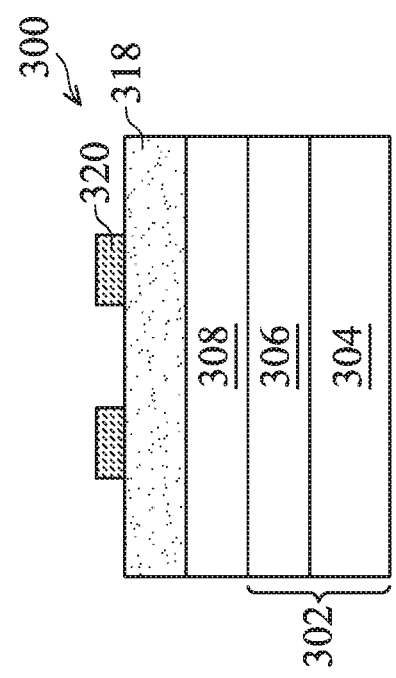
Figures 1, 3G:
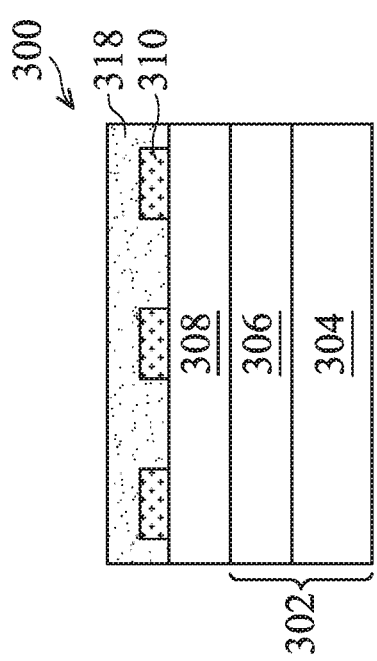
Figures 1, 3H:
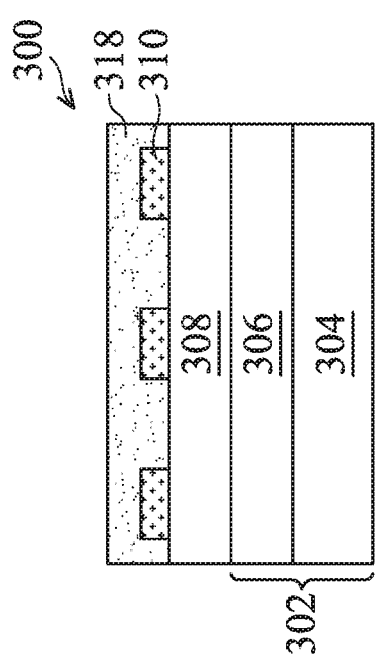
Figures 1, 3I:
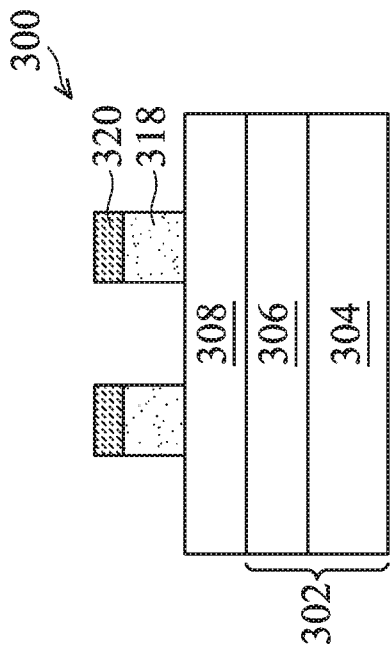
Figures 2, 3I:
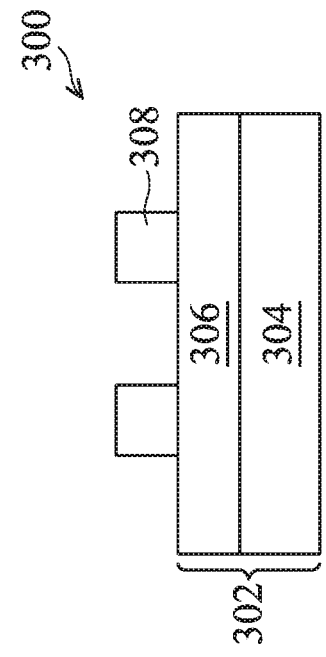
Figures 1, 3J:
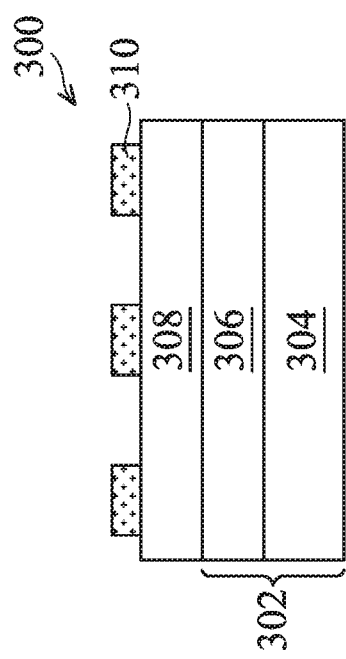
Figures 2, 3J:
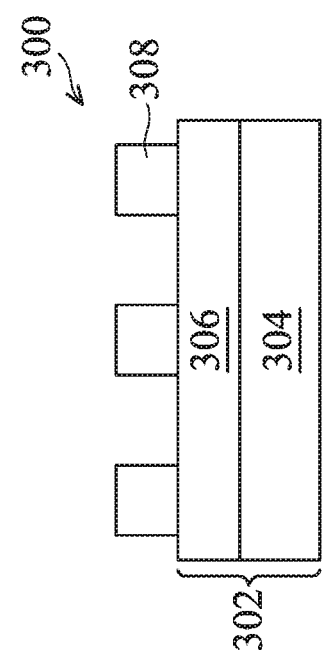

At operation 138, the method 100 (FIG. 1B) patterns the HM layer 318 to have the geometries of the group 200B (or 210B) of the mandrel patterns 202 (or 212) by a process including a second photolithograph process. Referring to FIGS. 3H-1 and 3H-2, a resist pattern 320 is formed over the HM layer 318. The resist pattern 320 may be formed by spin-coating a resist layer over the HM layer 318, exposing the resist layer to a pattern corresponding to the group 200B (or 210B), performing post-exposure bake processes, and developing the resist layer to form the resist pattern 320. Referring to FIGS. 3I-1 and 3I-2, the HM layer 318 is etched using the resist pattern 320 as an etch mask, thereby forming a second plurality of mandrel patterns over the HM layer 308, corresponding to the group 200B (or 210B). Referring to FIGS. 3J-1 and 3J-2, the HM layer 308 is etched using both the patterned HM layer 310 and the patterned HM layer 318 as an etch mask, thereby forming the mandrel patterns 202 (or 212) in the HM layer 308. The etching processes for the HM layers 318 and 308 may independently be a dry etching, a wet etching, or other suitable etching. The examples in FIGS. 3J-1 and 3J-2 show island-type mandrel patterns 202. Similar fabrication process may be used for forming trench-type mandrel patterns 212, for example, by depositing a material layer over the patterned HM layer 308, planarizing a top surface of the material layer to expose the patterned HM layer 308, and removing the patterned HM layer 308, thereby forming the trench-type mandrel patterns 212 in the material layer.

At operation 106, the method 100 (FIG. 1A) may optionally perform a cut process to remove one or more of the mandrel patterns 202 (or 212). In an embodiment, a cut process is another photolithography process that forms a masking element over a portion of the mandrel patterns 202 (or 212) and leaves another portion of the mandrel patterns 202 (or 212) exposed. Then, another etching process is performed to remove the exposed portion of the mandrel patterns 202, or a deposition process is performed to fill in the exposed portion of the mandrel patterns 212. A further description of this cut process will be described in association with FIGS. 5A-5E later.

Figures 1, 3K:
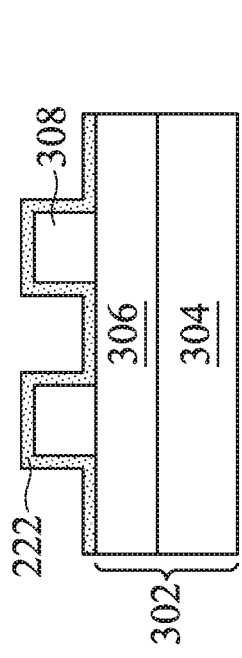
Figures 2, 3K:
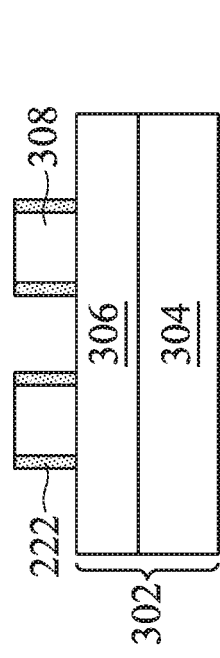
Figures 1, 3L:
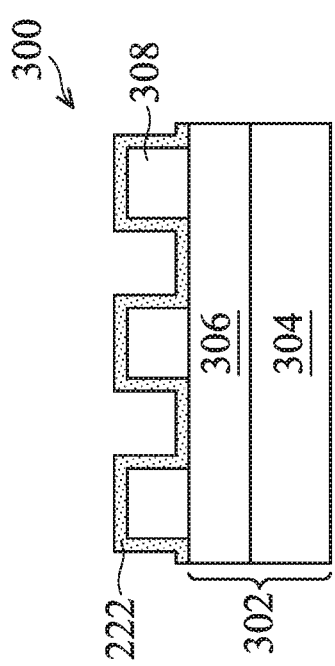
Figures 2, 3L:
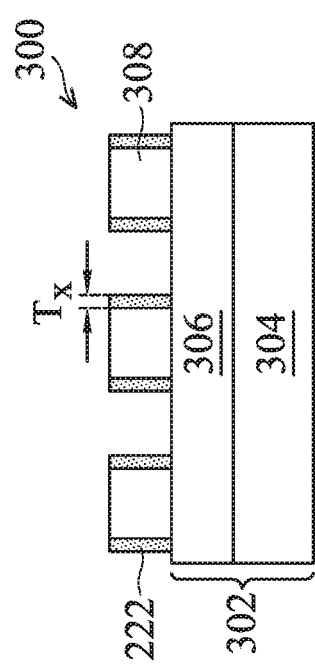

At operation 108, the method 100 (FIG. 1A) forms spacers 222 on sidewalls of the mandrel patterns 202 (or 212) which are in the form of the patterned HM layer 308. Referring to FIGS. 3K-1 and 3K-2, a spacer layer 222 is deposited over the patterning target layer 306 and over the patterned HM layer 308 as a blanket layer. The spacer layer 222 includes a nitride such as silicon nitride or titanium nitride in some embodiments and may be deposited using CVD, PVD, ALD, or other suitable deposition methods. Referring to FIGS. 3L-1 and 3L-2, an anisotropic (dry) etching process is performed to remove portions of the spacer layer 222 from the top surfaces of the patterning target layer 306 and the patterned HM layer 308. Other portions of the spacer layer 222 remain on the sidewalls of the mandrel patterns 308 and become the spacers 222. In the present embodiment, a thickness $T_x$ of the spacers 222 is about equal to the spacing $S_x$ in FIGS. 2A and 2B.

Figure 3M:
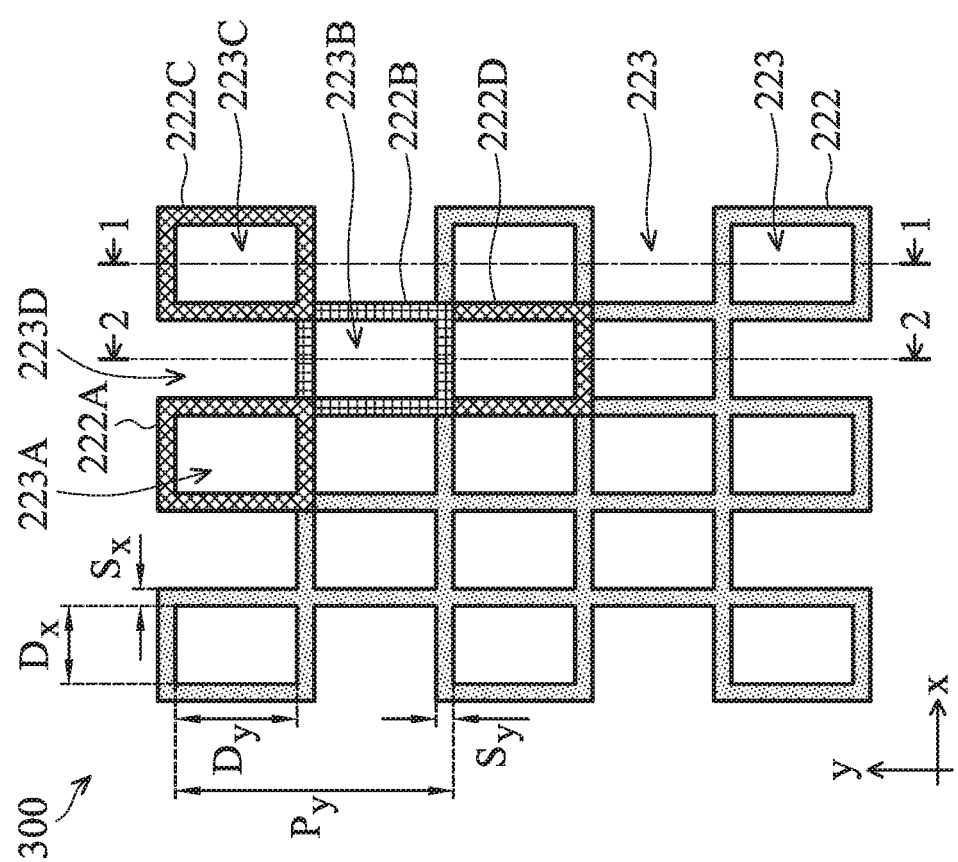
FIGS. 3M and 3P are top views of forming a semiconductor device according to the method of FIG. 1A, in accordance with some embodiments.
Figures 2, 3N:
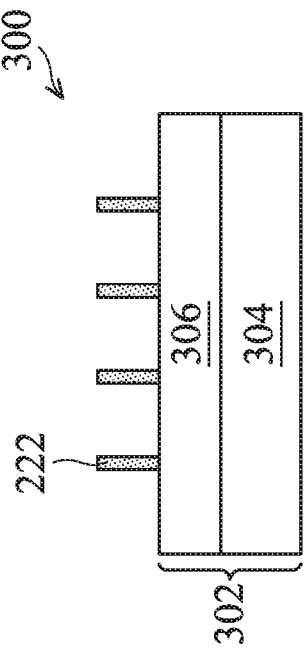
Figures 1, 3N:
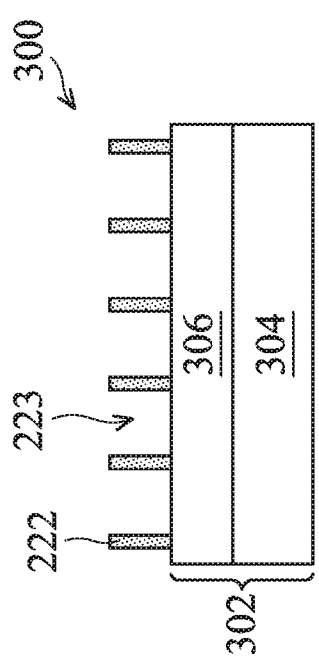

At operation 110, the method 100 (FIG. 1A) removes the mandrel patterns 202 (or 212), thereby forming trenches 223 that are at least partially surrounded by the spacers 222. FIG. 3M shows a top view of the spacers 222 and the trenches 223, while FIGS. 3N-1 and 3N-2 show cross sectional views of the semiconductor device 300 along the "1-1" and "2-2" lines of FIG. 3M, respectively. The trenches 223 have the dimensions that generally match the dimensions of the mandrel patterns 202 in FIG. 2A (or the mandrel patterns 212 in FIG. 2B), taking into account dimension variations through the various photolithography and etching processes above. The geometry of the trenches 223 conforms to the general guideline discussed above, i.e., a rectangular or square array of nanodomains 226 are to be formed inside each of the trenches 223 and the array has at most 4 row and at most 4 columns. Further, some of the trenches 223 are surrounded by the spacers 222 on all sides while some of the trenches 223 are only partially surrounded by the spacers 222. For example, trenches 223A, 223B, and 223C are fully surrounded by the spacers 222A, 222B, and 222C, respectively, while trench 223D is surrounded on three sides by the spacers 222A, 222B, and 222C. Still further, the spacers 222 are connected to each other. For example, a corner of the spacer 222A joins a corner of the spacer 222B, and another corner of the spacer 222B joins a corner of the spacer 222C. The spacers 222A and 222C are disposed on sidewalls of the mandrel patterns 202 (or 212) formed using the first photolithography, while the spacer 222B is disposed on sidewalls of the mandrel pattern 202 (or 212) formed using the second photolithography. In another example, a spacer 222D shares a side with the spacer 222B.

At operation 112, the method 100 (FIG. 1A) treats the surfaces of the spacers 222 and the patterning target layer 306. The operation 112 may use a plasma treatment or applying a surface modification material to the spacers 222 and the patterning target layer 306 by a coating and/or rinsing process. The treatment makes the surfaces of the spacers 222 and the patterning target layer 306 suitable for the subsequent DSA process, i.e., a BCP will be induced to form first and second constituent polymers wherein the second constituent polymer surrounds the first constituent polymer and the first constituent polymer comprises nanodomains oriented vertically to the substrate 302. For example, the treatment may make the surfaces of the spacers 222 and the patterning target layer 306 more hydrophilic or hydrophobic, depending on the BCP to be used.

Figures 2, 3O:
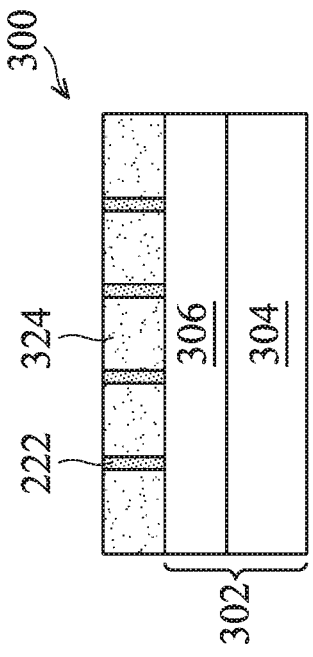
Figures 1, 3O:
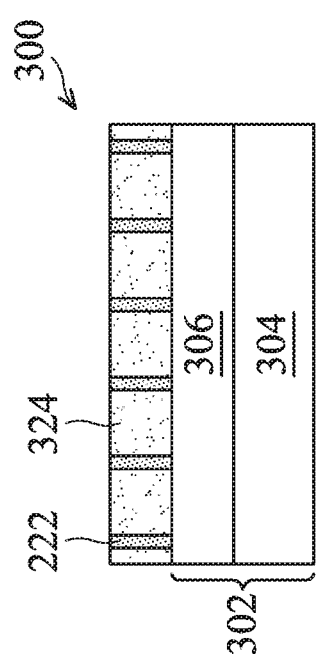

At operation 114, the method 100 (FIG. 1A) deposits a BCP 324 into the trenches 223. Referring to FIGS. 3O-1 and 3O-2, in embodiments, the BCP 324 is selected from the group consisting of poly(styrene-b-vinyl pyridine), poly (styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), and combinations of the foregoing block copolymers. Further embodiments may also utilize a copolymer material 324 with a hydrophobic (or hydrophilic) first constituent and a hydrophilic (or hydrophobic) second constituent as this facilitates segregation of the constituent polymers. The BCP 324 is deposited with a coating or spin-on coating process in the present embodiment.

Figure 3P:
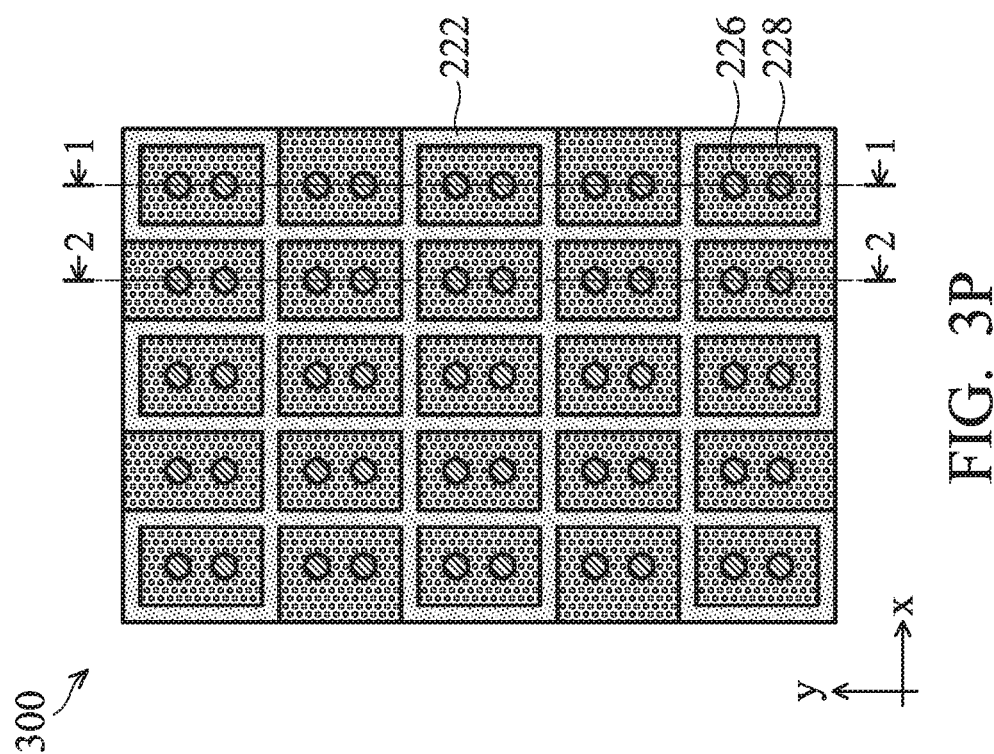
Figures 2, 3Q:
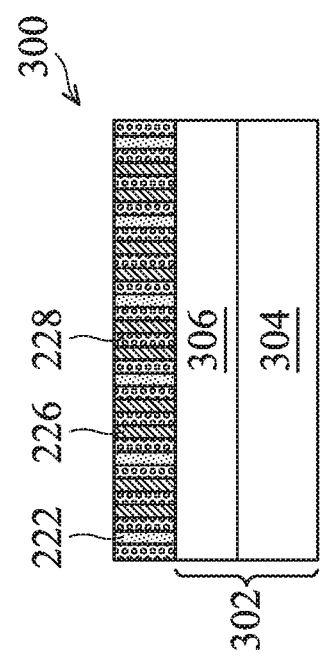
Figures 1, 3Q:
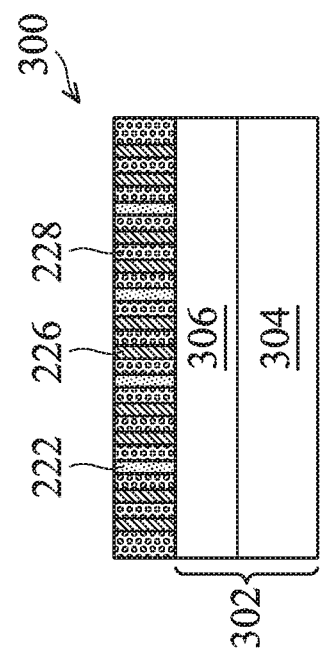

At operation 116, the method 100 (FIG. 1A) induces microphase separation in the BCP 324 (i.e., constituent polymers in the BCP 324 segregate). FIG. 3P shows a top view of the semiconductor device 300, while FIGS. 3Q-1 and 3Q-2 show cross sectional views of the semiconductor device 300 along the "1-1" and "2-2" lines of FIG. 3P, respectively. Referring to FIG. 3P, in the present embodiment, the BCP 324 includes two constituent polymers, a first constituent polymer (or first nanodomains) 226 and a second constituent polymer (or second nanodomains) 228. The dimension, shape, and configuration of the first and second constituent polymers 226 and 228 depend on various factors, such as the material used, the relative amounts of the constituent polymers, process variables such as temperature, the surface property of the spacers 222, among other factors. The spacers 222 act as the guiding pattern for microphase separation. An array of first constituent polymers 226 are formed within each trench 223 (FIG. 3M). In the present embodiment, the array is a 1×2 array (or a 2×1 array). Further, each of the first constituent polymers 226 is a cylinder and is surrounded by the second constituent polymers 228. Still further, the first and second constituent polymers 226 and 228 are oriented vertically to the substrate 302. In various embodiments, the inducing of the microphase separation may include heating, cooling, introduction of a solvent, application of a magnetic field, and/or other techniques.

At operation 116, the method 100 (FIG. 1A) may optionally perform a cut process to remove one or more of the first and second constituent polymers 226 and 228. In an embodiment, this cut process is another photolithography process that forms a masking element over a portion of the first and second constituent polymers 226 and 228 and leaves another portion thereof exposed. Then, one or more deposition and/or etching processes are performed to remove the exposed portion of the first and second constituent polymers 226 and 228 from the subsequent pattern-transfer process. A further description of this cut process will be described in association with FIGS. 6A-6F later.

Figures 1, 3R:
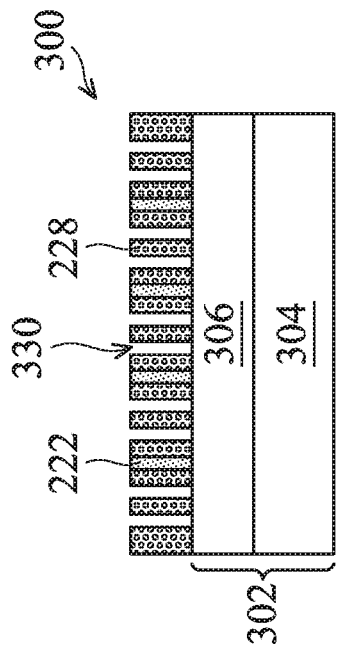
Figures 2, 3R:
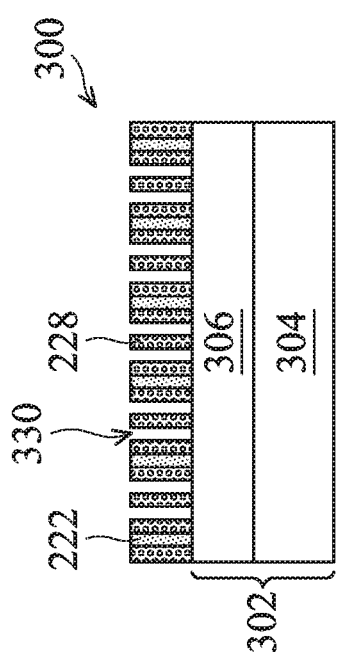
Figures 1, 3S:
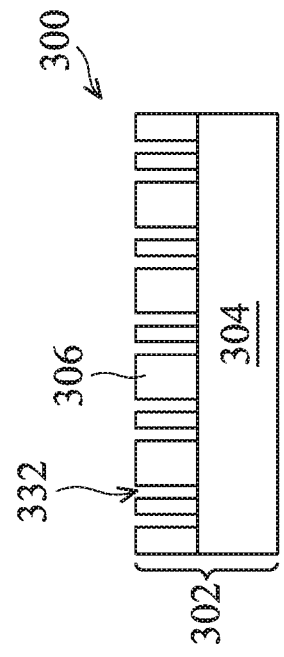
Figures 2, 3S:
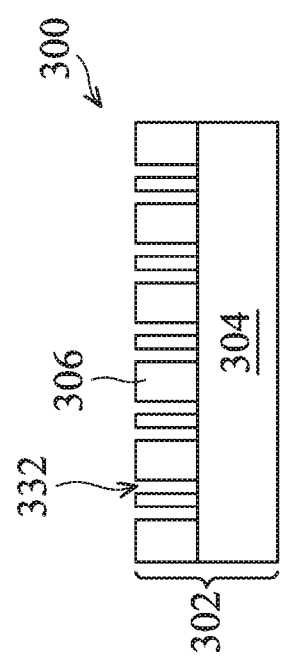

At operation 118, the method 100 (FIG. 1A) transfers a pattern corresponding to either the first constituent polymers 226 or the second constituent polymers 228 to the substrate 302. Referring to FIGS. 3R-1 to 3S-2, in the present embodiment, a pattern corresponding to the first constituent polymers 226 is transferred to the patterning target layer 306. Referring to FIGS. 3R-1 and 3R-2, the first constituent polymers 226 is selectively removed by an etching process that does not etch or insignificantly etches the spacers 222 and the second constituent polymers 228, thereby forming openings 330. Referring to FIGS. 3S-1 and 3S-2, the patterning target layer 306 is etched through the openings 330, thereby transferring the pattern to the patterning target layer 306 to have a plurality of trenches 332. The spacers 222 and the second constituent polymers 228 are removed thereafter. In an embodiment, the trenches 332 are contact holes for forming contact features therein such as source contacts, drain contacts, gate contacts, and vias connecting different metal interconnect layers.

At operation 120, the method 100 (FIG. 1A) forms a final pattern or device. In an example, the method 100 forms contacts in the contact holes 332. For example, the method 100 may form a barrier layer on sidewalls of the contact holes 332 and subsequently fill in the contact holes 332 with a conductive material. The barrier layer may comprise tantalum (Ta), tantalum nitride (TaN), or another suitable metal-diffusion barrier material; and may be deposited using CVD, PVD, ALD, or other suitable processes. The conductive material may use aluminum (Al), tungsten (W), copper (Cu), cobalt (Co), combinations thereof, or other suitable material; and may be deposited using a suitable process, such as CVD, PVD, plating, and/or other suitable processes.

FIGS. 4A-4F illustrate the operations 104 through 116 of an embodiment of the method 100 (FIG. 1A) where the mandrel patterns are only partial arrays. Referring to FIG. 4A, a target pattern 400 includes mandrel patterns 202 arranged in a seemingly irregular pattern. A group 400A of the mandrel patterns 202 forms a partial array, which is a subset of the array 200A (FIG. 2A). A group 400B of the mandrel patterns 202 forms another partial array, which is a subset of the array 200B (FIG. 2A). Rows of the group 400A interleaved with rows of the group 400B. Columns of the group 400A interleaved with columns of the group 400B. The mandrel patterns 202 have restricted sizes, as discussed above with respect to FIG. 2A. FIG. 4B shows another target pattern 410 which includes mandrel patterns 212. A group 410A of the mandrel patterns 212 forms a partial array, while another group 410B of the mandrel patterns 212 forms another partial array. The target patterns 400 and 410 are similar except that the mandrel patterns 202 are of island-type while the mandrel patterns 212 are of trench-type. The mandrel patterns 202 and 212 may be formed over a substrate as discussed above with respect to operation 104. Referring to FIGS. 4C and 4D, spacers 222 are formed on sidewalls of the mandrel patterns 202 and 212 in a manner similar to operation 108. Referring to FIG. 4E, the mandrel patterns are removed in a manner similar to operation 110, leaving trenches 223 surrounded by the spacers 222 on at least three sides thereof. Referring to FIG. 4F, nanodomains 226 are formed in each of the trenches 223 in a rectangular or square array which has limited sizes as discussed above with respect to operations 112, 114, and 116.

The mandrel patterns shown in FIGS. 4A and 4B may be designed as such, or they may be derived from the mandrel patterns shown in FIGS. 2A and 2B by using a cut process as discussed above with respect to operation 106, which is further illustrated in FIGS. 5A-5E. Referring to FIG. 5A, mandrel patterns 202 are arranged in two arrays 200A and 200B that are interleaved by rows and columns, as discussed above. Referring to FIG. 5B, cut patterns 504 are implemented, in a separate photolithography in one example, to remove some of the mandrel patterns 202. In an embodiment, the cut process forms a masking element over the mandrel patterns 202 and the masking element exposes the portion of the mandrel patterns 202 overlapping with the cut pattern 504. Then a selective etching process removes this portion of the mandrel patterns 202. Referring to FIG. 5C, the remaining mandrel patterns 202 form partial arrays as discussed above with respect to FIG. 4A, and spacers 222 are formed on sidewalls of the mandrel patterns 202. Referring to FIG. 5D, the mandrel patterns 202 are removed to form trenches 223. Referring to FIG. 5E, nanodomains 226 are formed in each of the trenches 223 in a rectangular or square array which has limited sizes.

Figures 1, 6G:
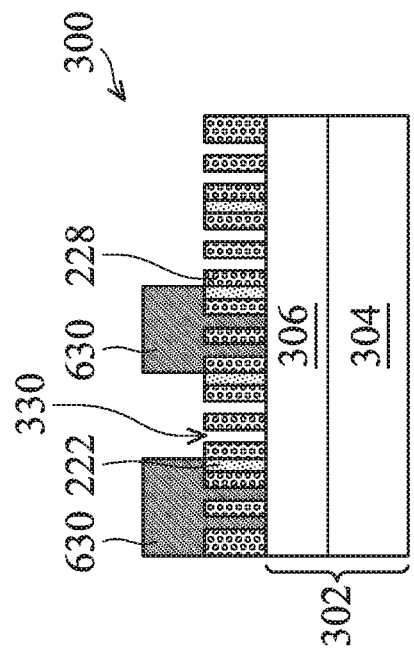
Figures 2, 6G:
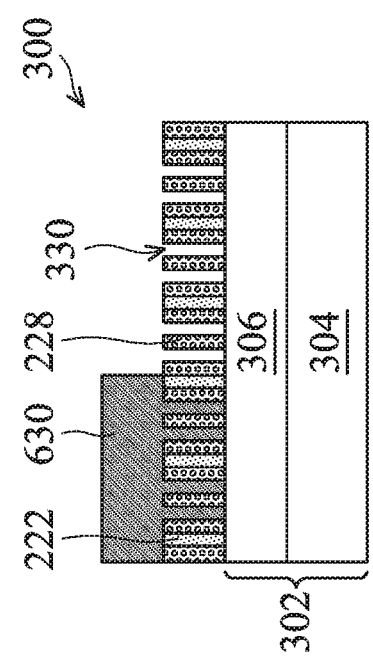

FIGS. 6A-6F illustrate a cut process as discussed above with respect to operation 118. FIG. 6A illustrates mandrel patterns 202 configured in two interleaving arrays 200A and 200B. FIG. 6B illustrates spacers 222 disposed on sidewalls of the mandrel patterns 202. FIG. 6C illustrates trenches 223 being surrounded by the spacers 222. FIG. 6D illustrates nanodomains 226 being formed using the spacers 222 as guiding patterns. Referring to FIG. 6E, cut patterns 630 are formed using a photolithography process, removing a portion of the nanodomains 226. FIG. 6F illustrates the remaining nanodomains 226 for pattern-transfer after the cut process. In an embodiment, the cut patterns 630 are implemented as a dielectric material filling the trenches 330 as shown in FIGS. 6G-1 and 6G-2 which are cross sectional views of the semiconductor device 300 along the "1-1" and "2-2" lines of FIG. 6F respectively.

Figure 1C:
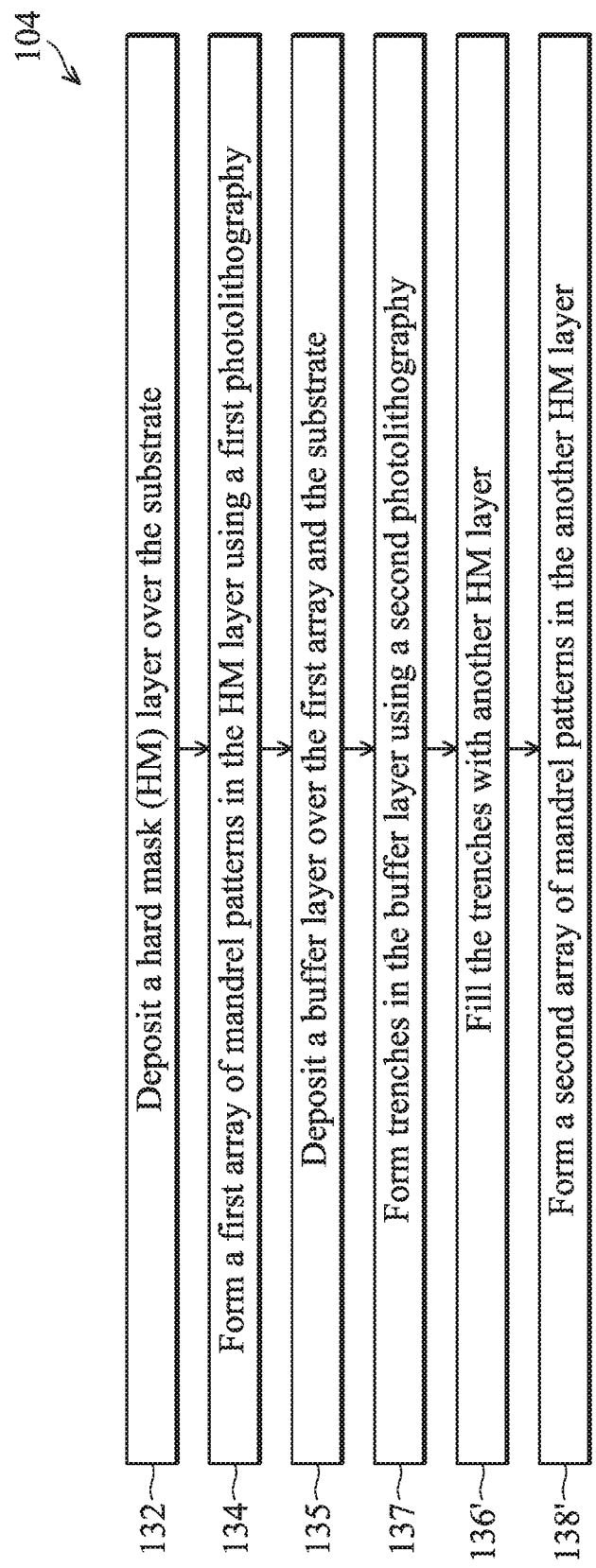

FIG. 1C illustrates another embodiment of operation 104 according to aspects of the present disclosure. In this embodiment, operation 104 includes the operation 132 for depositing a HM layer 310 over the substrate 302 and the operation 134 for forming a first array of mandrel patterns in the HM layer 310 using a first photolithography. Further operations of the operation 104 are briefly discussed below in conjunction with FIGS. 7A-1 through 7F-2 which are cross sectional views of the semiconductor device 300 along the "1-1" and "2-2" lines of FIG. 2A respectively.

Figures 2, 7A:
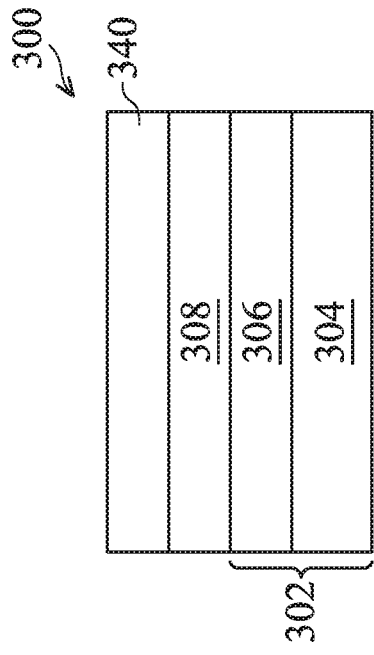
Figures 2, 7B:
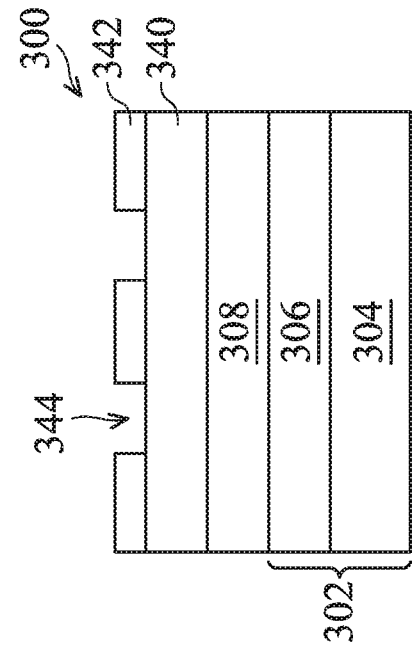
Figures 1, 7A:
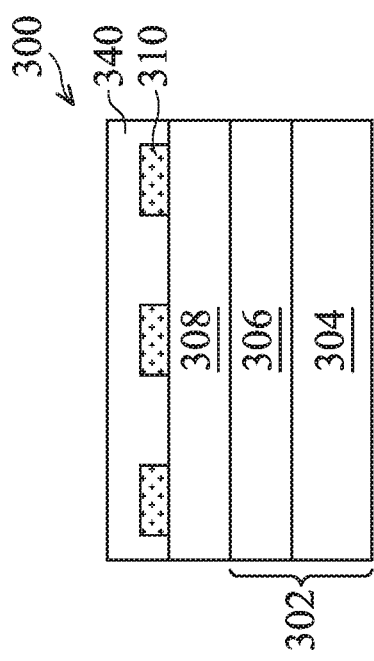
Figures 1, 7B:
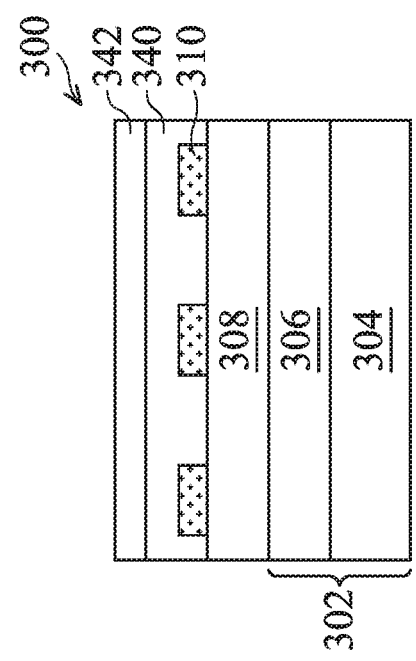
Figures 1, 7C:
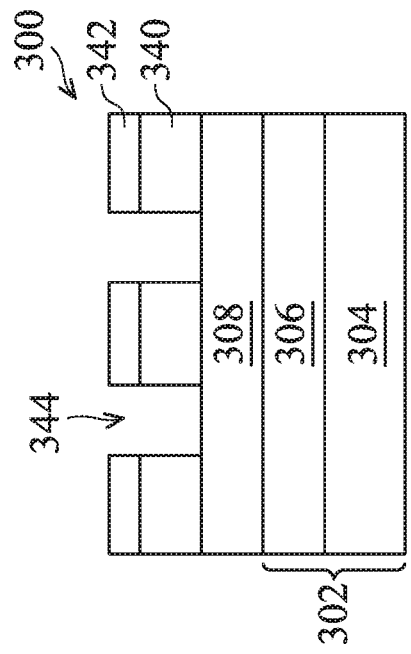
Figures 2, 7C:
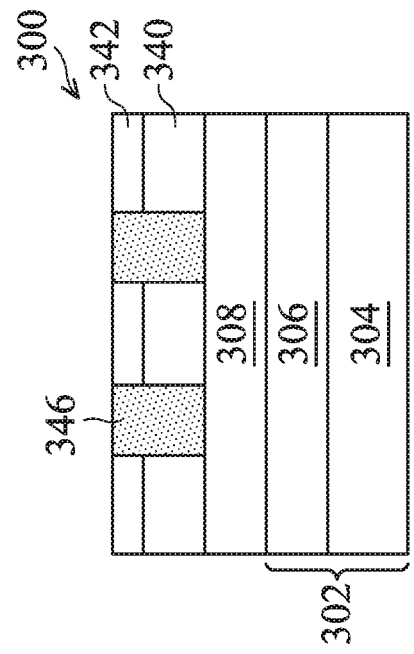
Figures 1, 7D:
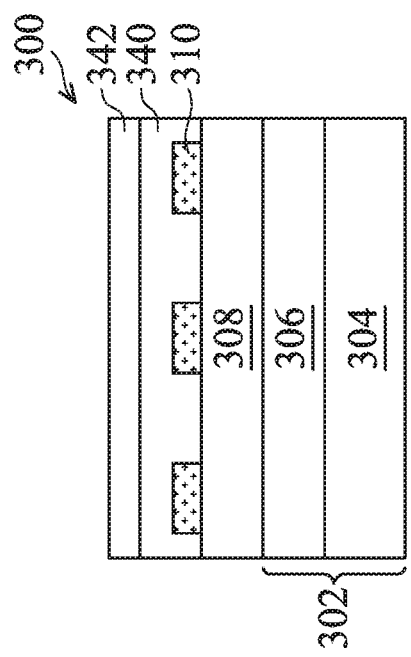
Figures 2, 7D:
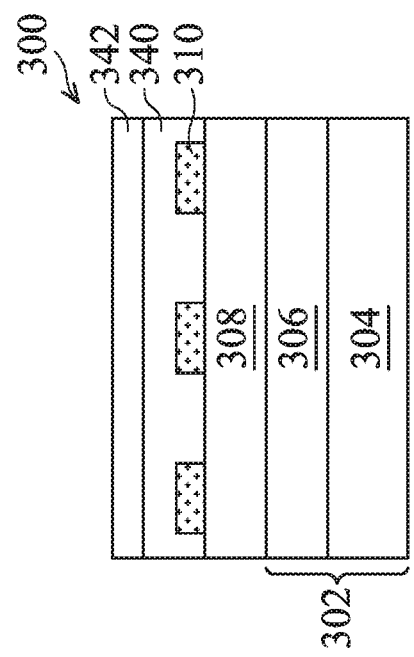
Figures 1, 7E:
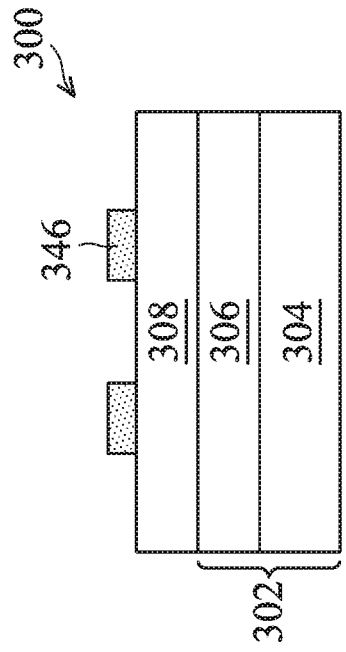
Figures 1, 7F:
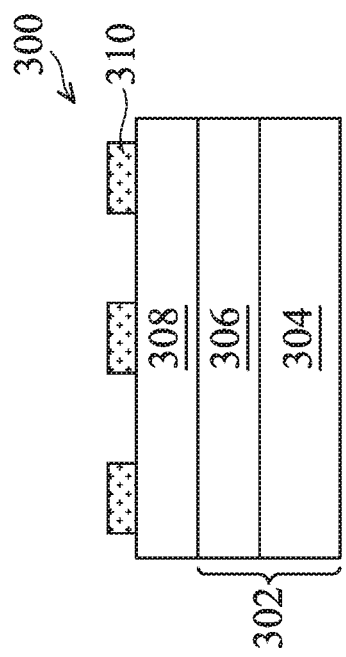
Figures 2, 7E:
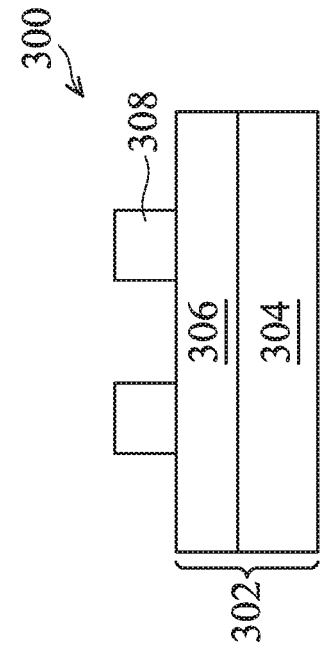
Figures 2, 7F:
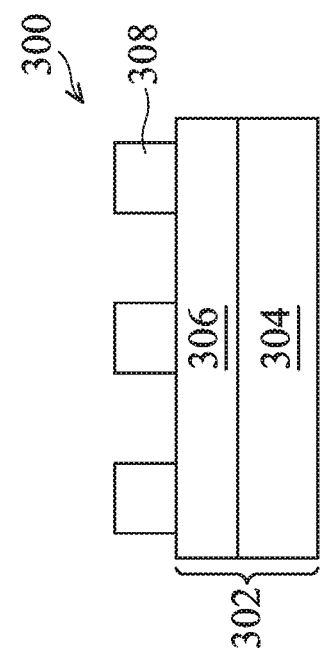

At operation 135, a buffer layer 340 is deposited over the substrate 302 to cover the mandrel patterns 310 underneath and to provide a planar top surface (FIGS. 7A-1 and 7A-2). In some embodiments, the buffer layer 340 includes one or more polymers including silicon and may be formed using a spin-on coating method and/or a suitable deposition method. At operation 137, trenches 344 are formed in the buffer layer 340. Referring to FIGS. 7B-1 and 7B-2, a resist pattern 342 is formed over the buffer layer using a second photolithography process and provides the trenches 344. Referring to FIGS. 7C-1 and 7C-2, the buffer layer 340 is etched with the resist pattern 342 as an etch mask, thereby extending the trenches 344 into the buffer layer 340. At operation 136', the trenches 344 are filled with a dielectric HM material 346 as a second array of mandrel patterns (FIGS. 7D-1 and 7D-2). At operation 138', the semiconductor device 300 is planarized using a CMP process to expose the mandrel patterns 310. Then, the buffer layer 340 is removed by an etching process, leaving the mandrel patterns 310 and 346 over the HM layer 308 (FIGS. 7E-1 and 7E-2). Thereafter, the HM layer 308 is etched with the mandrel patterns 310 and 346 as an etch mask, forming the mandrel patterns in the HM layer 308 (FIGS. 7F-1 and 7F-2).

Although not intended to be limiting, one or more embodiments of the present disclosure provide many benefits to a semiconductor device and the formation thereof. For example, embodiments of the present disclosure provide guiding patterns and methods of forming the same for a DSA process. The guiding patterns have restricted sizes and restricted configuration. The guiding patterns guide the DSA process to produce cylindrical nanodomains arranged in a rectangular or square array. Such configuration of nanodomains advantageously fits into existing IC design and fabrication flow, for example, in designing and forming contact holes.

In one exemplary aspect, the present disclosure is directed to a method. The method includes providing a substrate; forming mandrel patterns over the substrate; and forming spacers on sidewalls of the mandrel patterns. The method further includes removing the mandrel patterns, thereby forming trenches that are at least partially surrounded by the spacers. The method further includes depositing a copolymer material in the trenches, wherein the copolymer material is directed self-assembling; and inducing microphase separation within the copolymer material, thereby defining a first constituent polymer surrounded by a second constituent polymer.

In another exemplary aspect, the present disclosure is directed to a method that includes providing a substrate; forming mandrel patterns over the substrate; forming spacers on sidewalls of the mandrel patterns; and removing the mandrel patterns, thereby forming trenches that are at least partially surrounded by the spacers. The method further includes depositing a copolymer material in the trenches, wherein the copolymer material is directed self-assembling; and inducing microphase separation within the copolymer material, thereby defining a first constituent polymer surrounded by a second constituent polymer. The method further includes transferring a pattern corresponding to either the first constituent polymer or the second constituent polymer to the substrate.

In another exemplary aspect, the present disclosure is directed to a method that includes providing a substrate; forming a first array of mandrel patterns over the substrate using a first photolithography process; and forming a second array of mandrel patterns over the substrate using a second photolithography process. Rows of the first array and rows of the second array are interleaved, and columns of the first array and columns of the second array are also interleaved. The method further includes forming spacers on sidewalls of the mandrel patterns; and removing the mandrel patterns, thereby forming trenches that are at least partially surrounded by the spacers. The method further includes depositing a copolymer material in the trenches, wherein the copolymer material is directed self-assembling; and inducing microphase separation within the copolymer material, thereby defining a first constituent polymer surrounded by a second constituent polymer. The method further includes transferring a pattern corresponding to the first constituent polymer to the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a substrate having spacers disposed thereupon, wherein the spacers define a trench disposed between the spacers;
    forming a directed self-assembling copolymer in the trench; and
    performing a microphase separation process on the directed self-assembling copolymer to form a first constituent polymer in the trench and a second constituent polymer in the trench disposed between the first constituent polymer and the spacers, such that the second constituent polymer fully surrounds the first constituent polymer from a top view.

2. The method of claim 1 further comprising:
    selectively removing the first constituent polymer such that the second constituent polymer and the spacers remain.

3. The method of claim 2 further comprising:
    performing a fabrication process on a portion of the substrate exposed by the removing of the first constituent polymer.

4. The method of claim 3, wherein the fabrication process includes etching the portion of the substrate exposed by the removing of the first constituent polymer.

5. The method of claim 1, wherein the providing of the substrate having the spacers includes:
    forming a mandrel on the substrate;
    forming the spacers on side surfaces of the mandrel; and
    removing the mandrel such that the spacers remain.

6. The method of claim 1, wherein the microphase separation process forms a plurality of regions of the first constituent polymer between the spacers and separated by the second constituent polymer.

7. The method of claim 6, wherein each of the plurality of regions of the first constituent polymer is cylindrical.

8. The method of claim 1, wherein:
    the trench is a first trench;
    the spacers further define a second trench disposed between the spacers;
    the directed self-assembling copolymer is further formed in the second trench; and
    the performing of the microphase separation process forms the first constituent polymer and the second constituent polymer in the second trench.

9. A method, comprising:
    providing a substrate;
    forming a patterned hard mask on the substrate;
    forming spacers on sidewalls of the patterned hard mask;
    removing the patterned hard mask such that the spacers define a plurality of trenches bounded by the spacers and the substrate,
    forming a copolymer material in the trenches;
    inducing microphase separation within the copolymer material, thereby defining, in a first trench of the trenches, a first cylindrical-shaped constituent polymer and a second constituent polymer that wraps around the first cylindrical-shaped constituent polymer and is disposed between the first cylindrical-shaped constituent polymer and the spacers; and
    transferring a pattern corresponding to either the first constituent polymer or the second constituent polymer to the substrate.

10. The method of claim 9, wherein the first cylindrical-shaped constituent polymer and the second constituent polymer have different etching sensitivities.

11. The method of claim 9, wherein the transferring of the pattern includes removing the first cylindrical-shaped constituent polymer such that the second constituent polymer and the spacers remain.

12. The method of claim 9, wherein the transferring of the pattern includes etching an exposed portion of the substrate.

13. The method of claim 9, wherein the microphase separation forms a plurality of regions of the first constituent cylindrical-shaped polymer between the spacers that are separated by the second constituent polymer.

14. The method of claim 13, wherein each of the plurality of regions of the first cylindrical-shaped constituent polymer is vertically oriented to the substrate.

15. A method, comprising:
    providing a substrate;
    forming an array of mandrel patterns over the substrate;
    forming spacers on sidewalls of each mandrel of the array of mandrel patterns;
    removing the array of mandrel patterns, thereby defining trenches between the spacers;
    depositing a copolymer material in the trenches;
    inducing microphase separation within the copolymer material, thereby defining a first constituent polymer laterally and concentrically surrounded by a second constituent polymer within each of the trenches; and
    transferring a pattern corresponding to the first constituent polymer to the substrate.

16. The method of claim 15, wherein the transferring of the pattern includes selectively removing the first constituent polymer.

17. The method of claim 15, wherein the transferring of the pattern includes etching a portion of the substrate exposed by the second constituent polymer and the spacers.

18. The method of claim 1, wherein the directed self-assembling copolymer is selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), and combinations thereof.

19. The method of claim 1, wherein the first constituent polymer and the second constituent polymer have different etching sensitivities.

20. The method of claim 15, wherein the first constituent polymer is cylindrical in a top-down view.

* * * * *